United States Patent
Han et al.

(10) Patent No.: US 12,457,690 B2
(45) Date of Patent: Oct. 28, 2025

(54) CIRCUIT BOARD

(71) Applicant: LG INNOTEK CO., LTD., Seoul (KR)

(72) Inventors: Jung Eun Han, Seoul (KR); Se Woong Na, Seoul (KR); Joon Il Cha, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 204 days.

(21) Appl. No.: 18/009,761

(22) PCT Filed: Jun. 11, 2021

(86) PCT No.: PCT/KR2021/007337
§ 371 (c)(1),
(2) Date: Dec. 12, 2022

(87) PCT Pub. No.: WO2021/251794
PCT Pub. Date: Dec. 16, 2021

(65) Prior Publication Data
US 2023/0247769 A1    Aug. 3, 2023

(30) Foreign Application Priority Data

Jun. 12, 2020 (KR) .................. 10-2020-0071478

(51) Int. Cl.
*H05K 1/02* (2006.01)
*H05K 1/11* (2006.01)
(Continued)

(52) U.S. Cl.
CPC ................ *H05K 3/28* (2013.01); *H05K 1/11* (2013.01); *H05K 1/115* (2013.01); *H05K 1/18* (2013.01); *H05K 2203/1377* (2013.01)

(58) Field of Classification Search
CPC ............ H05K 3/28; H05K 2203/1377; H05K 1/0298; H05K 2201/0191;
(Continued)

(56) References Cited

U.S. PATENT DOCUMENTS 6,809,415 B2    10/2004  Tsukada et al.
9,252,096 B2 *   2/2016  Hondo .............. H01L 23/49827
(Continued)

FOREIGN PATENT DOCUMENTS

CN        101959366      1/2011
EP        1 143 776      10/2001
(Continued)

OTHER PUBLICATIONS

International Search Report dated Sep. 29, 2021 issued in Application No. PCT/KR2021/007337.
(Continued)

*Primary Examiner* — Ishwarbhai B Patel
(74) *Attorney, Agent, or Firm* — KED & ASSOCIATES

(57) ABSTRACT

A circuit board including an insulating layer including a first region and a second region; a plurality of outer layer circuit patterns disposed on upper surfaces of the first region and the second region of the insulating layer; and a solder resist including a first part disposed on the first region of the insulating layer and a second part disposed on the second region of the insulating layer. The first part includes an upper surface having a curved surface and exposes an upper surface of an outer layer circuit pattern disposed on the first region of the insulating layer. The second part covers an upper surface of an outer layer circuit pattern disposed on
(Continued)

the second region of the insulating layer, and at least a part of the upper surface of the first part is positioned lower than the upper surface of the outer layer circuit pattern.

10 Claims, 15 Drawing Sheets

(51) Int. Cl.
*H05K 3/28* (2006.01)
*H05K 1/18* (2006.01)

(58) Field of Classification Search
CPC ......... H05K 2203/0597; H05K 3/3452; H05K 3/061; H05K 3/4611
See application file for complete search history.

(56) References Cited

U.S. PATENT DOCUMENTS

| | | | |
|---|---|---|---|
| 9,565,760 B2 | 2/2017 | Ishibashi et al. | |
| 9,578,743 B2 | 2/2017 | Nagai et al. | |
| 9,668,341 B2* | 5/2017 | Furuichi | H05K 3/4602 |
| 10,014,246 B2* | 7/2018 | Kung | H05K 1/181 |
| 2001/0002728 A1 | 6/2001 | Tsukada et al. | |
| 2005/0167281 A1* | 8/2005 | Ohsawa | G11B 5/486 |
| | | | 216/2 |
| 2010/0288539 A1* | 11/2010 | Washima | H05K 3/243 |
| | | | 174/250 |
| 2011/0011626 A1 | 1/2011 | Yamauchi et al. | |
| 2011/0214915 A1 | 9/2011 | Kawamura et al. | |
| 2014/0037862 A1 | 2/2014 | Lee et al. | |
| 2014/0196939 A1* | 7/2014 | Nishida | H05K 3/28 |
| | | | 174/261 |
| 2014/0284081 A1 | 9/2014 | Nishida et al. | |
| 2014/0338958 A1 | 11/2014 | Yamauchi et al. | |
| 2015/0000968 A1 | 1/2015 | Ishibashi et al. | |
| 2016/0095216 A1* | 3/2016 | Nagai | H05K 3/3452 |
| | | | 174/250 |

FOREIGN PATENT DOCUMENTS

| | | |
|---|---|---|
| JP | 06-140748 | 5/1994 |
| JP | 2000-040868 | 2/2000 |
| JP | 2010-267652 | 11/2010 |
| JP | 2015-207676 | 11/2015 |
| JP | 2015-216332 | 12/2015 |
| JP | 2016-072398 | 5/2016 |
| JP | 2017-117568 | 6/2017 |
| JP | 2017-152477 | 8/2017 |
| KR | 10-2014-0018016 | 2/2014 |
| KR | 10-2014-0069213 | 6/2014 |
| KR | 10-2015-0002506 | 1/2015 |
| KR | 10-20180055220 | 5/2018 |
| KR | 10-2018-0113996 | 10/2018 |
| WO | WO 2014/030309 | 2/2014 |

OTHER PUBLICATIONS

Korean Office Action issued in Application No. 10-2020-0071478 dated Feb. 20, 2025.
Japanese Office Action issued in Application No. 2022-575613 dated Apr. 22, 2025.
European Search Report issued in Application No. 21821356.9 dated Jun. 18, 2024.

* cited by examiner

[FIG. 1A]
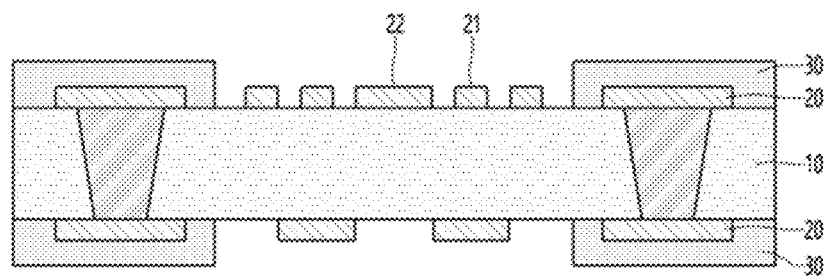
[FIG. 1B]
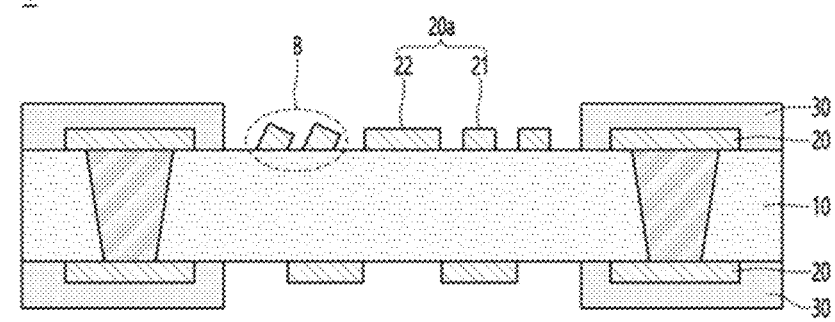

[FIG. 2]
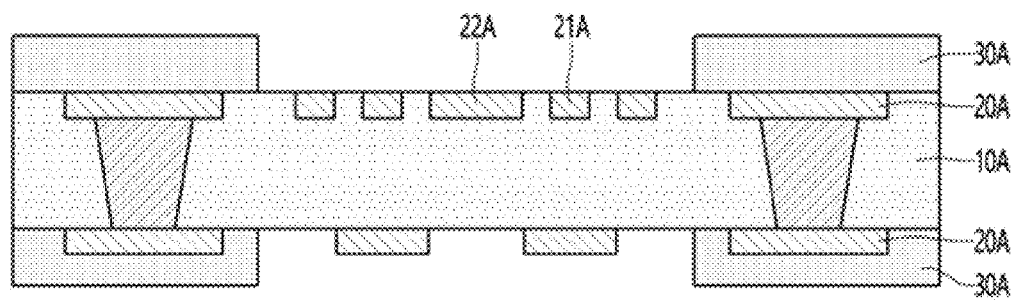

[FIG. 3]
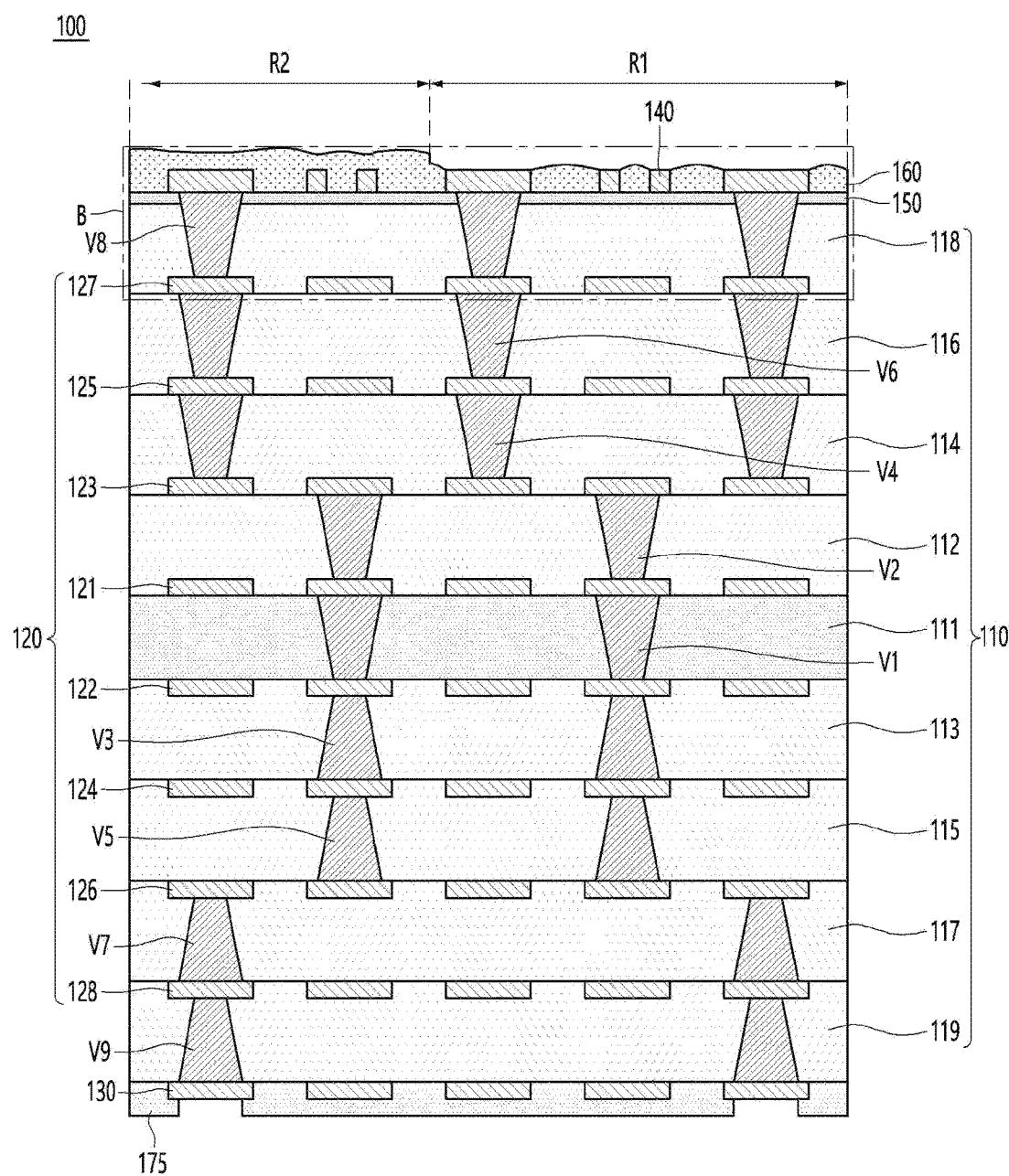

【FIG. 4A】
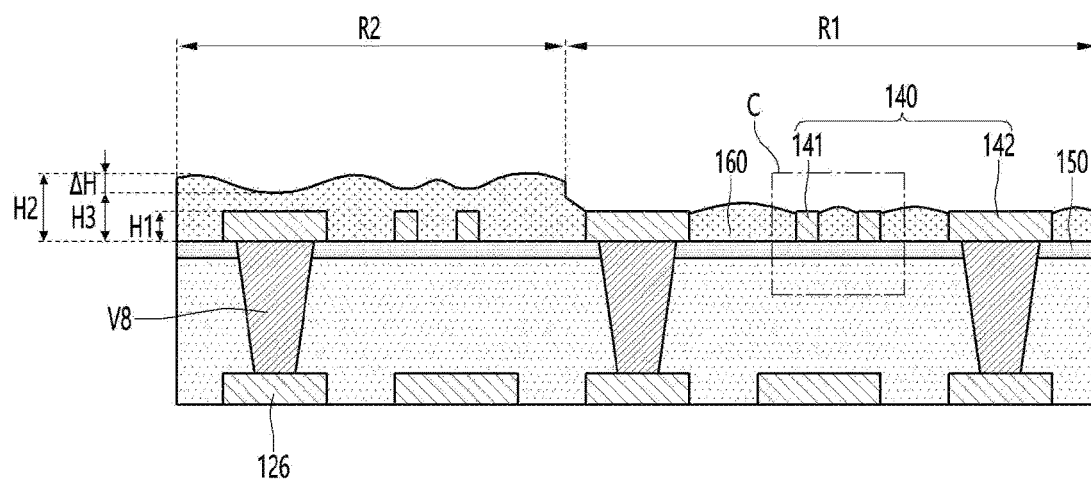
【FIG. 4B】
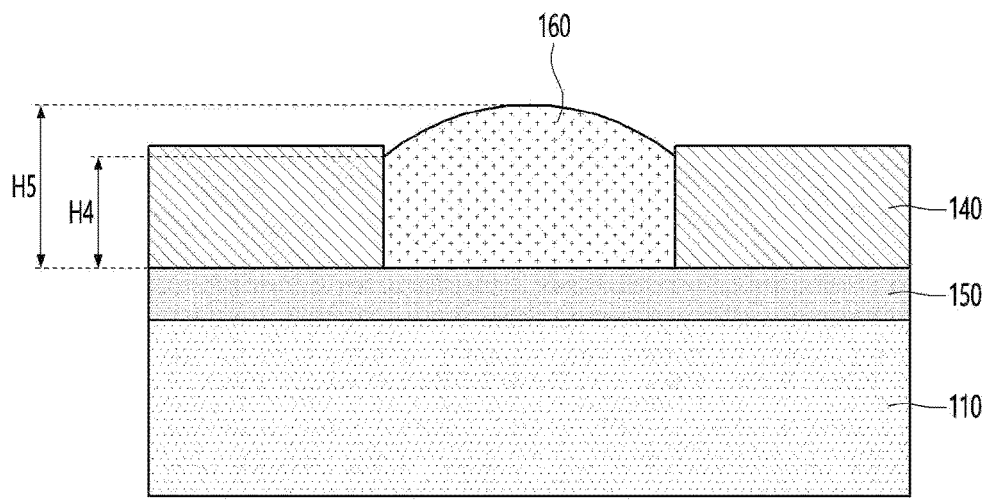

[FIG. 4C]
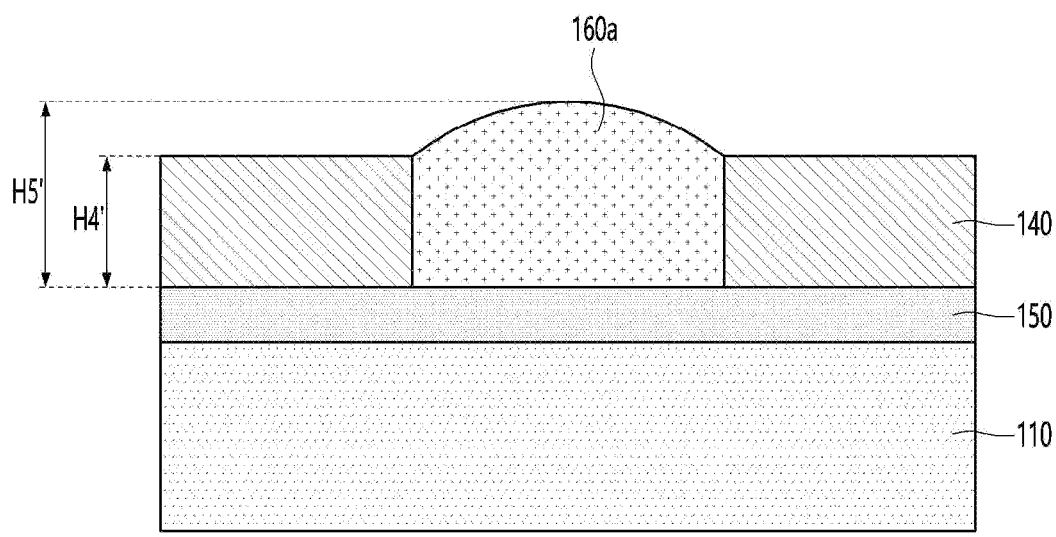
[FIG. 4D]
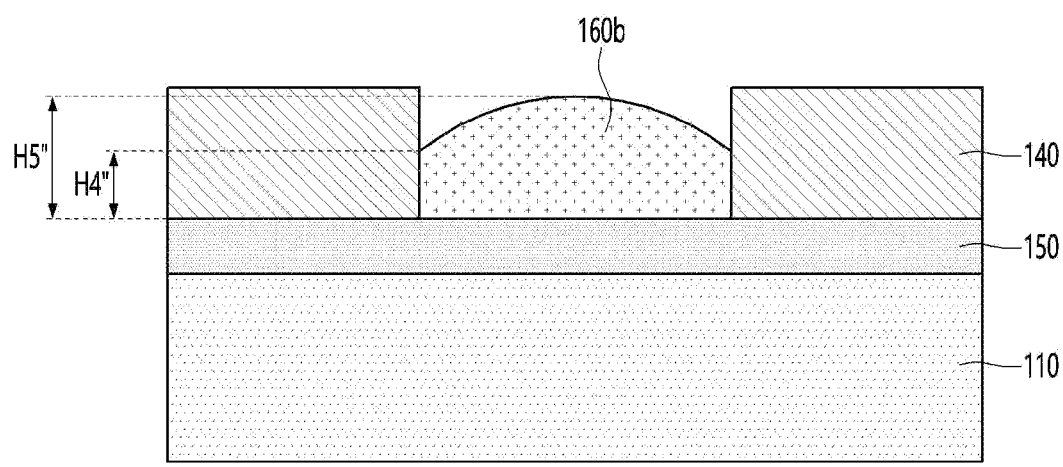

[FIG. 5]
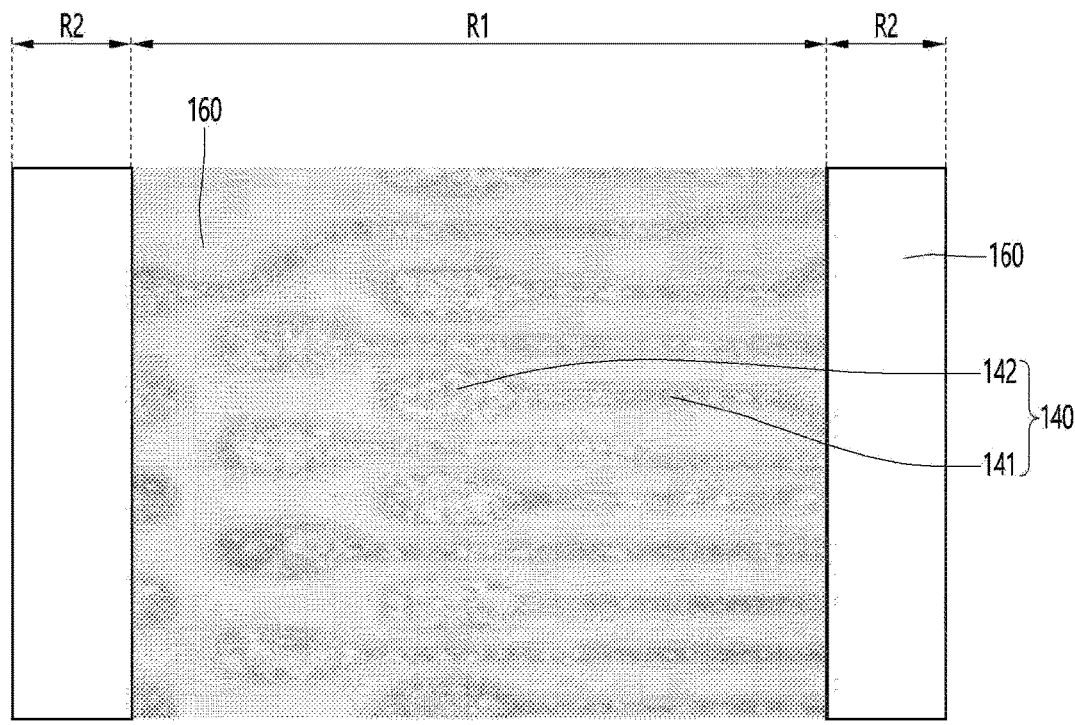

[FIG. 6]
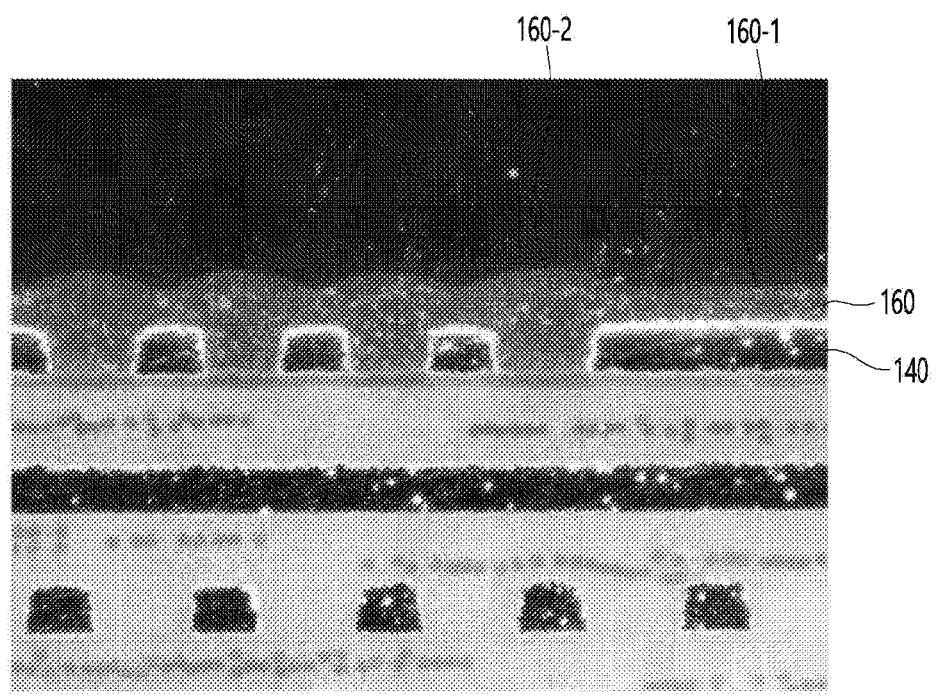

[FIG. 7]
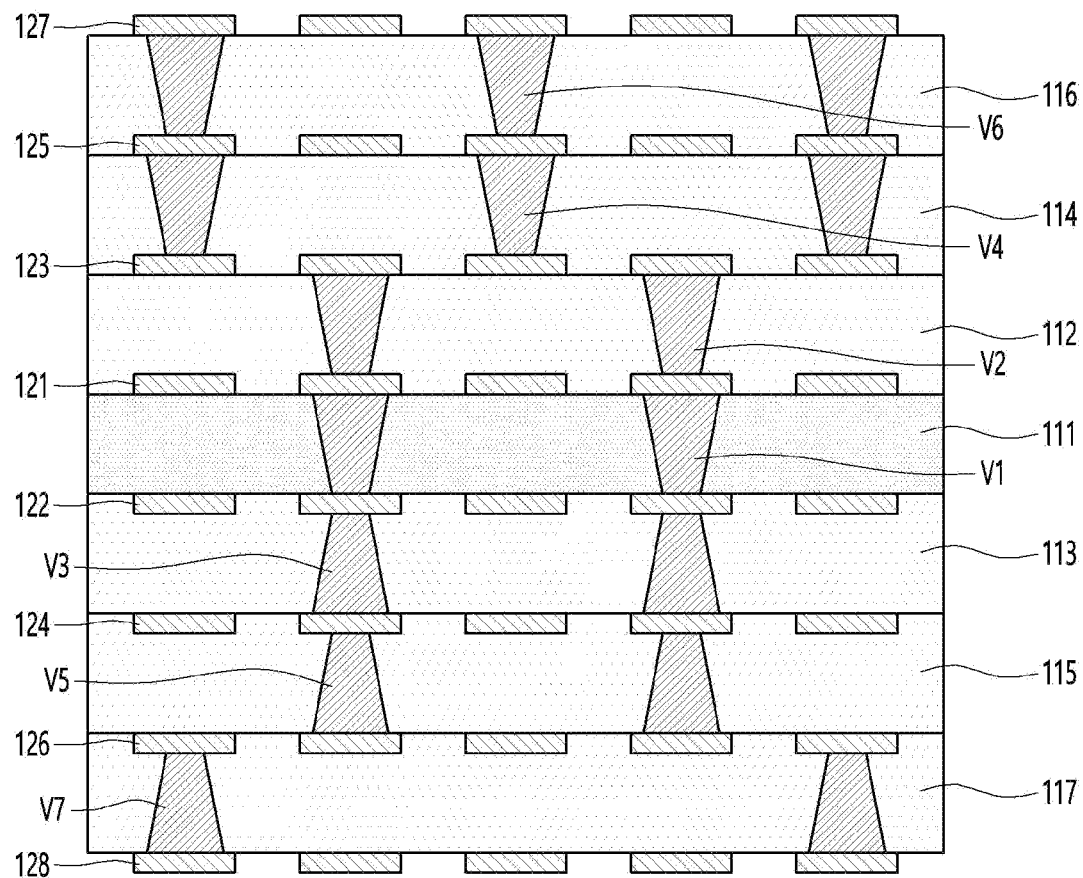

[FIG. 8]
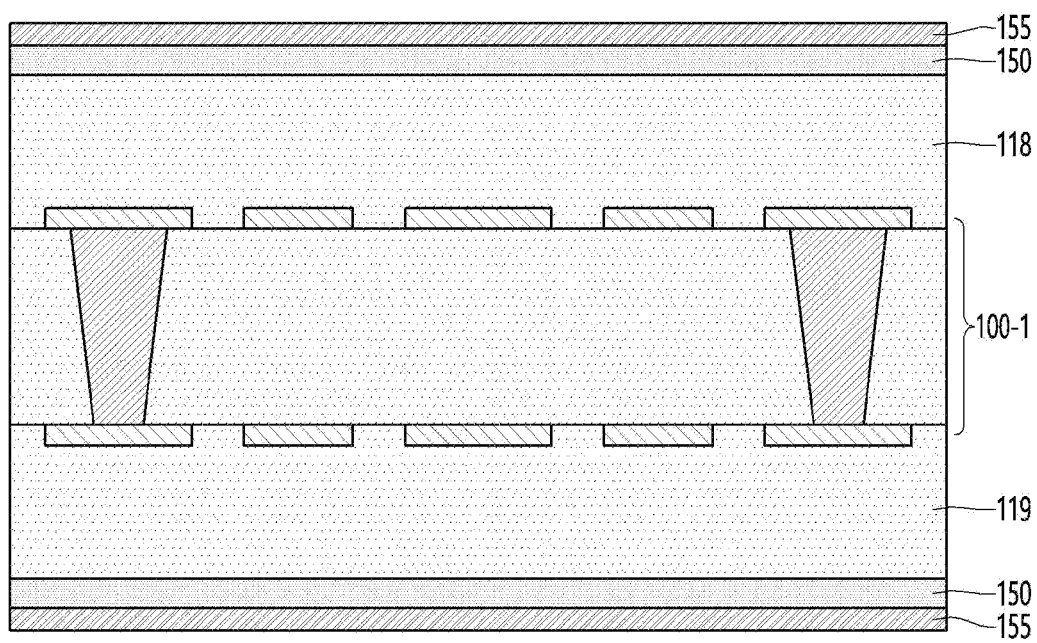

[FIG. 9]
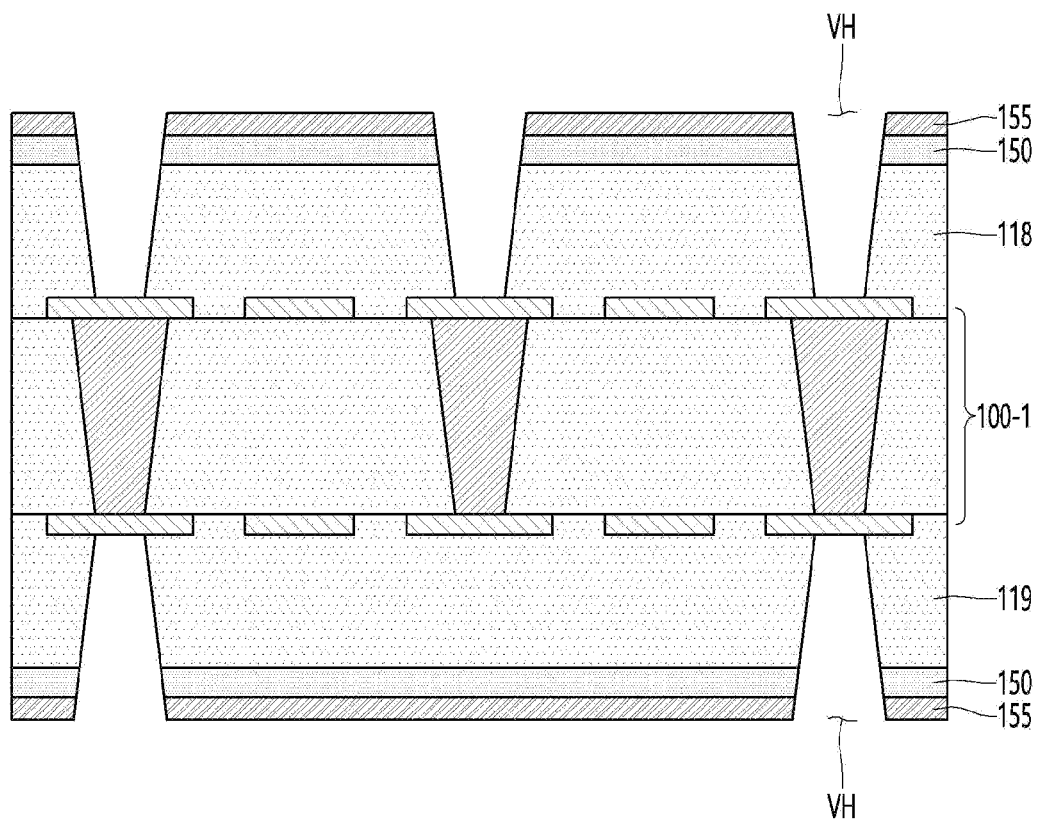

【FIG. 10】
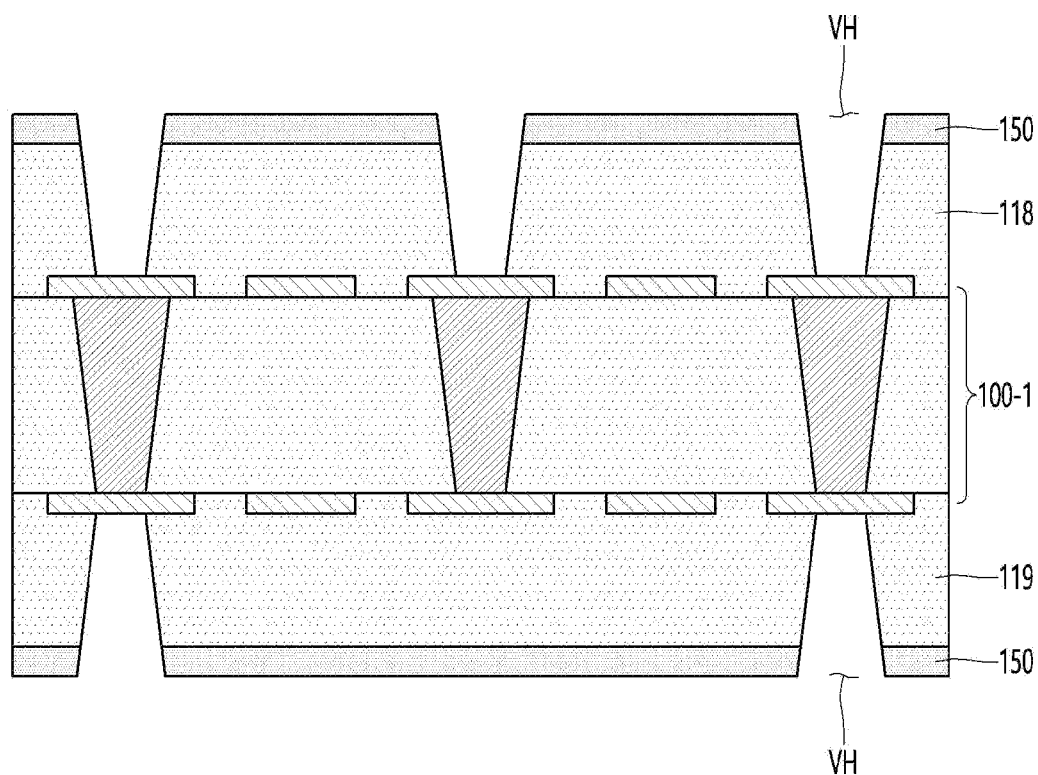

[FIG. 11]
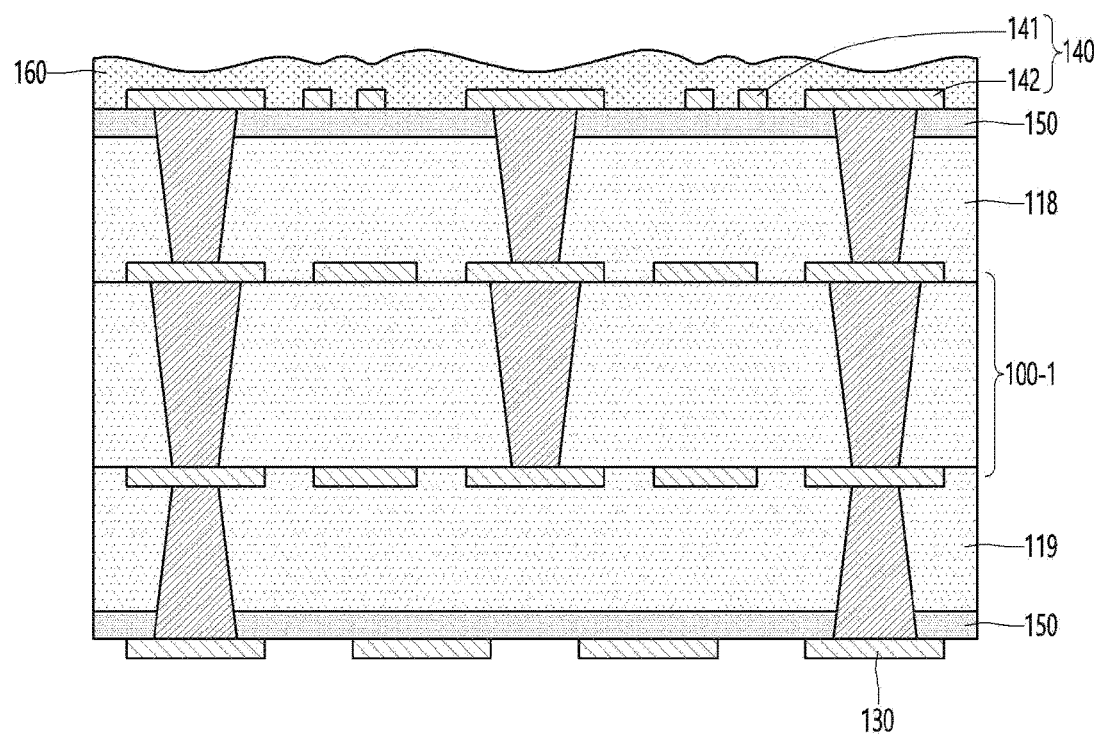

[FIG. 12]
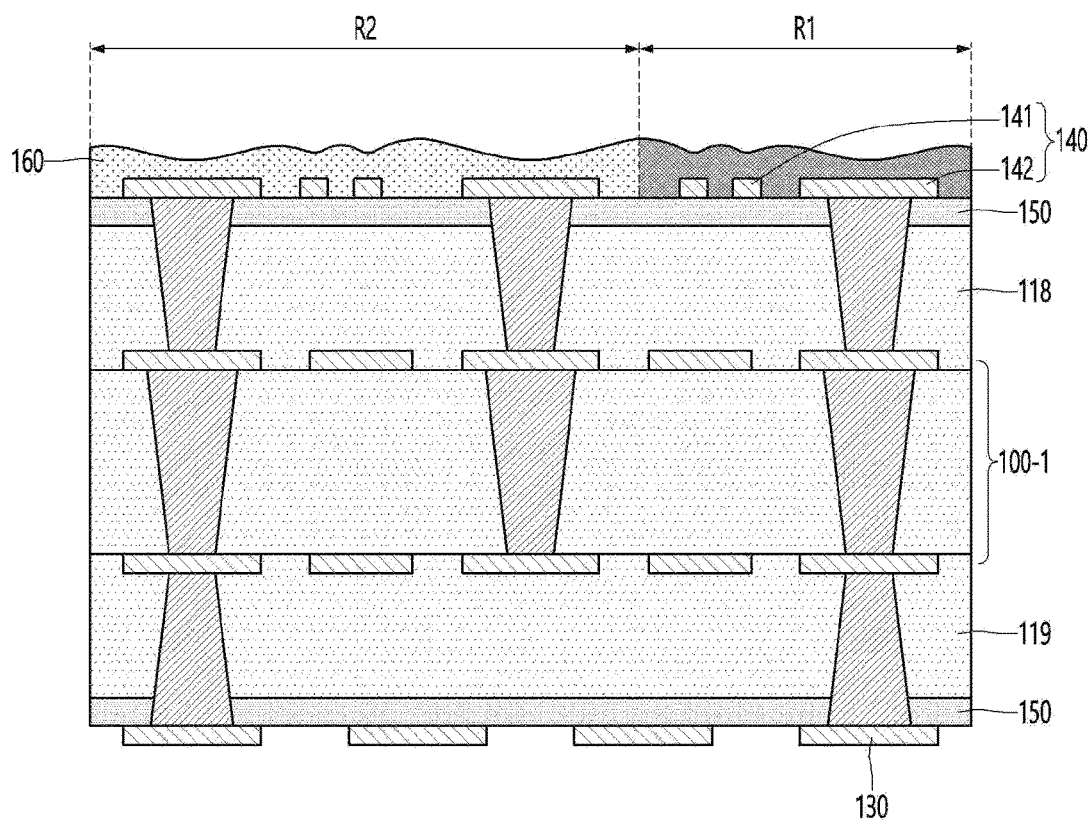

[FIG. 13]
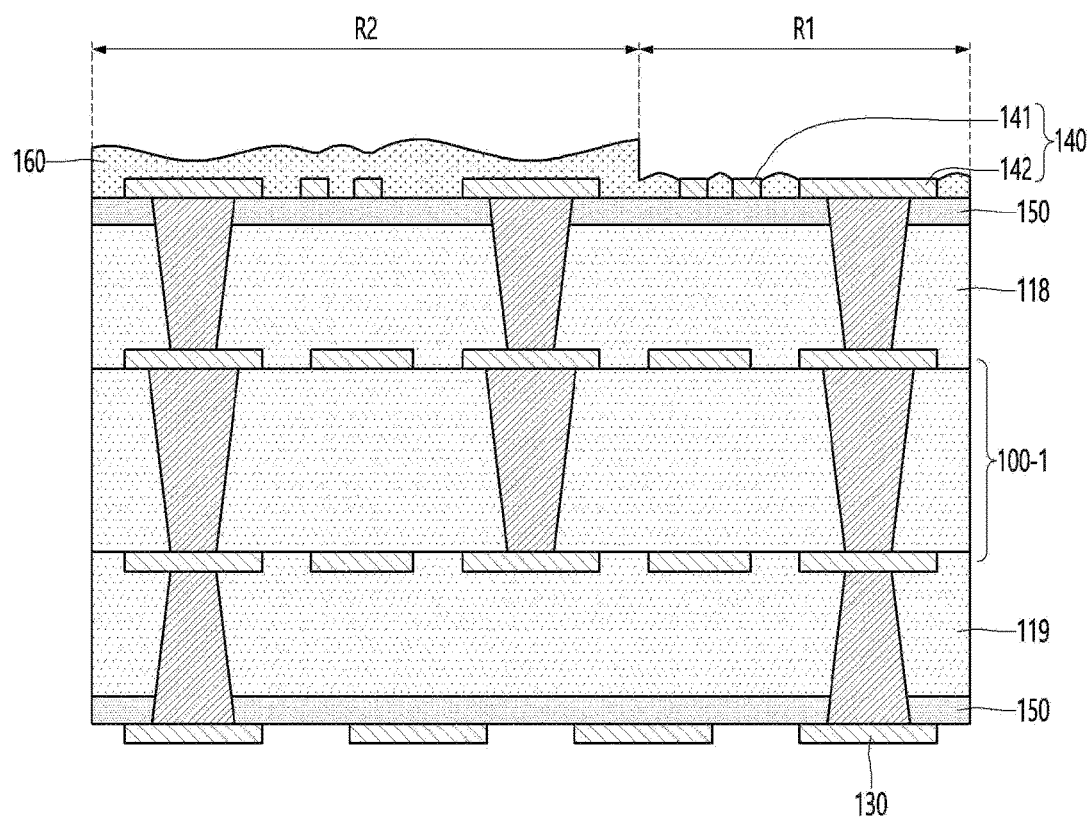

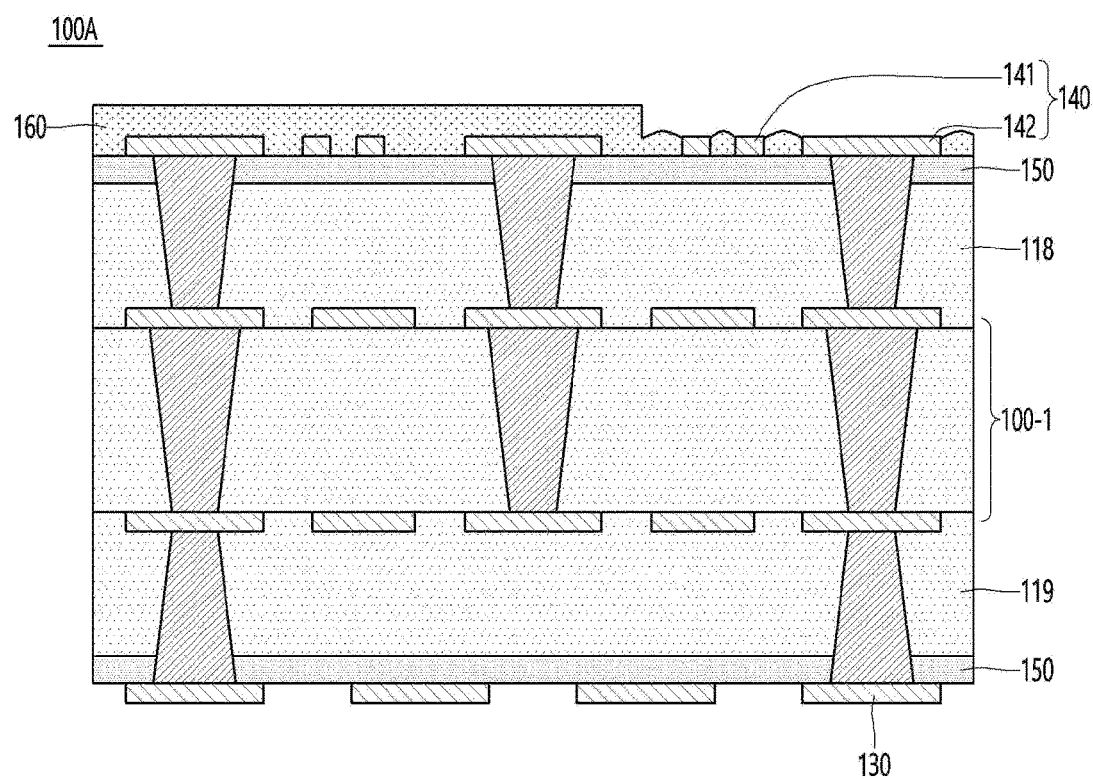
[FIG. 14]

CIRCUIT BOARD

CROSS-REFERENCE TO RELATED PATENT APPLICATIONS

This application is a U.S. National Stage Application under 35 U.S.C. § 371 of PCT Application No. PCT/KR2021/007337, filed Jun. 11, 2021, which claims priority to Korean Patent Application No. 10-2020-0071478, filed Jun. 12, 2020, whose entire disclosures are hereby incorporated by reference.

TECHNICAL FIELD

The embodiment relates to a circuit board, and more particularly, to a circuit board capable of supporting and protecting an outermost circuit pattern in an open region using a solder resist and a method of manufacturing the same.

BACKGROUND ART

As miniaturization, weight reduction, and integration of an electronic component are accelerated, a line width of a circuit has been made fine. In particular, as a design rule of a semiconductor chip is integrated on a nanometer scale, a circuit line width of a package substrate or a printed circuit board on which the semiconductor chip is mounted has been made fine to several micrometers or less.

Various methods have been proposed in order to increase the degree of circuit integration of the printed circuit board, that is, to reduce the circuit line width. For the purpose of preventing loss of the circuit line width in an etching step for forming a pattern after copper plating, a semi-additive process (SAP) method and a modified semi-additive process (MSAP) have been proposed.

Then, an embedded trace substrate (hereinafter referred to as "ETS") method for embedding a copper foil in an insulating layer in order to implement a fine circuit pattern has been used in the industry. In the ETS method, instead of forming a copper foil circuit on a surface of the insulating layer, the copper foil circuit is manufactured in an embedded form in the insulating layer, and thus there is no circuit loss due to etching and it is advantageous for making the circuit pitch fine.

Meanwhile, recently, in order to meet a demand for wireless data traffic, efforts have been made to develop an improved 5G (5th generation) communication system or a pre-5G communication system. Here, the 5G communication system uses ultra-high frequency (mmWave) bands (sub 6 GHz, 28 GHz, 38 GHz, or higher frequencies) to achieve high data transfer rates.

In addition, in order to reduce a path loss of radio waves and increase a transmission distance of radio waves in the ultra-high frequency band, in the 5G communication system, integration technologies such as beamforming, massive multi-input multi-output (massive MIMO), and array antennas have been developed. Considering that it may be composed of hundreds of active antennas of wavelengths in the frequency bands, an antenna system becomes large relatively.

Since such an antenna and AP module are patterned or mounted on the printed circuit board, low loss on the printed circuit board is very important. This means that several substrates constituting the active antenna system, that is, an antenna substrate, an antenna power feeding substrate, a transceiver substrate, and a baseband substrate, should be integrated into one compact unit.

In addition, the circuit board applied to the 5G communication system as described above is manufactured in a trend of light, thin and compact, and accordingly, the circuit pattern is becoming gradually finer.

However, a circuit board including a conventional fine circuit pattern has a structure in which a circuit pattern disposed at an outermost portion protrudes above an insulating layer, and thus there is problem that the circuit pattern of the outermost portion easily collapses.

DISCLOSURE

Technical Problem

An embodiment provides a circuit board having a new structure and a method of manufacturing the same.

In addition, the embodiment provides a circuit board capable of supporting and protecting an outermost circuit pattern disposed in a SR open region using a solder resist and a method of manufacturing the same.

In addition, the embodiment provides a circuit board including a solder resist exposing a circuit pattern in a SR open region by performing an exposure and developing process, and a method of manufacturing the same.

In addition, the embodiment provides a circuit board including a solder resist having a surface convex in an upward direction and a method of manufacturing the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment includes: an insulating layer including a first region and a second region; an outer layer circuit patterns disposed on upper surfaces of the first region and the second region of the insulating layer; and a solder resist including a first part disposed on the first region of the insulating layer and a second part disposed on the second region of the insulating layer; wherein the first part of the solder resist is disposed while exposing an upper surface of an outer layer circuit pattern disposed on the first region of the insulating layer, the second part of the solder resist is disposed while covering an upper surface of an outer layer circuit pattern disposed on the second region of the insulating layer, at least a part of an upper surface of the first part of the solder resist is positioned lower than an upper surface of the outer layer circuit pattern, and the upper surface of the first part of the solder resist has a convex shape.

In addition, the first part of the solder resist includes a highest portion having a highest height of the upper surface of the first part of the solder resist and a lowest portion having a lowest height of the upper surface of the first part of the solder resist, and wherein the lowest portion is positioned closer to the outer layer circuit pattern than the highest portion.

In addition, the highest portion is positioned in a center region of an upper surface of the solder resist disposed between adjacent outer layer circuit patterns among the plurality of outer layer circuit patterns, the lowest portion is positioned in an edge region of an upper surface of the solder resist disposed between the adjacent outer layer circuit patterns, and wherein a height of the upper surface of the solder resist between the adjacent outer layer circuit patterns decreases from the center region to the edge region.

In addition, a height of the highest portion is greater than a height of the outer layer circuit pattern, and a height of the lowest portion is smaller than the height of the outer layer circuit pattern.

In addition, the height of the lowest portion satisfies a range of 70% to 95% of the height of the outer layer circuit pattern, and the height of the highest portion satisfies 102% to 120% of the height of the outer layer circuit pattern.

In addition, a height of the lowest portion satisfies a range of 80% to 97% of a height of the highest portion.

In addition, the second part of the solder resist includes: a 2-1 part overlapping the outer layer circuit pattern in a vertical direction; and a 2-2 part that does not overlap with the outer layer circuit pattern in the vertical direction; and a height of the 2-1 part is smaller than a height of the 2-2 part.

In addition, an upper surface of the 2-1 part of the solder resist has a concave shape, and an upper surface of the 2-2 part of the solder resist has a convex shape.

In addition, the insulating layer includes a plurality of layers, and the outer layer circuit pattern is disposed protruding from a surface of an uppermost insulating layer or a lowermost insulating layer of the plurality of layers.

In addition, the circuit board further includes a primer layer disposed between an upper surface of the insulating layer and a lower surface of the solder resist or a lower surface of the outer layer circuit pattern.

On the other hand, a method of manufacturing of the circuit board according to the embodiment includes: manufacturing an inner layer substrate; forming an uppermost insulating layer having a primer layer disposed on an upper surface on the inner layer substrate; forming an outer layer circuit pattern on the primer layer of the uppermost insulating layer; forming a solder resist layer on the primer layer and the outer layer circuit pattern; partially exposing and developing the solder resist layer to form a solder resist including a first part and a second part; wherein the solder resist layer includes a first portion disposed in a region vertically overlapping the outer layer circuit pattern and formed on the outer layer circuit pattern, and a second portion disposed in a region not vertically overlapping with the outer layer circuit pattern and formed on the primer layer; and wherein a height of the second portion is greater than a height of the first portion.

In addition, the insulating layer includes a first region in which the first part of the solder resist is disposed, and a second region in which the second part of the solder resist is disposed, wherein the first part of the solder resist is disposed while exposing an upper surface of an outer layer circuit pattern disposed on the first region of the insulating layer, the second part of the solder resist is disposed while covering an upper surface of an outer layer circuit pattern disposed on the second region of the insulating layer, at least a part of an upper surface of the first part of the solder resist is positioned lower than an upper surface of the outer layer circuit pattern, and the upper surface of the first part of the solder resist has a convex shape.

In addition, the first part of the solder resist includes a highest portion having a highest height of the upper surface of the first part of the solder resist and a lowest portion having a lowest height of the upper surface of the first part of the solder resist, and wherein the lowest portion is positioned closer to the outer layer circuit pattern than the highest portion.

In addition, the highest portion is positioned in a center region of an upper surface of the solder resist disposed between adjacent outer layer circuit patterns among the plurality of outer layer circuit patterns, the lowest portion is positioned in an edge region of an upper surface of the solder resist disposed between the adjacent outer layer circuit patterns, and wherein a height of the upper surface of the solder resist between the adjacent outer layer circuit patterns decreases from the center region to the edge region.

In addition, a height of the highest portion is greater than a height of the outer layer circuit pattern, and a height of the lowest portion is smaller than the height of the outer layer circuit pattern.

In addition, the height of the lowest portion satisfies a range of 70% to 95% of the height of the outer layer circuit pattern, and the height of the highest portion satisfies 102% to 120% of the height of the outer layer circuit pattern.

In addition, a height of the lowest portion satisfies a range of 80% to 97% of a height of the highest portion.

In addition, the second part of the solder resist includes: a 2-1 part overlapping the outer layer circuit pattern in a vertical direction; and a 2-2 part that does not overlap with the outer layer circuit pattern in the vertical direction; and a height of the 2-1 part is smaller than a height of the 2-2 part.

In addition, an upper surface of the 2-1 part of the solder resist has a concave shape, and an upper surface of the 2-2 part of the solder resist has a convex shape.

Advantageous Effects

A circuit board in the embodiment is a circuit board having a structure of multi-layers with eight or more layers and includes an outer layer circuit pattern disposed on an outer insulating layer positioned at an uppermost portion among the multi-layers and protruding above a surface of the outer insulating layer. In this case, the outer layer circuit pattern includes a first outer layer circuit pattern disposed in a first region that is an open region where the solder resist is not disposed, and a second outer layer circuit pattern positioned in a second region where the solder resist is disposed. In this case, the second outer layer circuit pattern may be supported and protected by the solder resist, but the first outer layer circuit pattern does not have a support layer capable of supporting the first outer layer circuit pattern, and thus there is a problem that the first outer layer circuit pattern may easily collapse due to various factors.

Accordingly, the embodiment allows remaining without removing all of the solder resist in the first region, and accordingly, the first outer layer circuit pattern can be supported and protected by the solder resist. According to this, the embodiment can solve problems such as collapsing or rubbing of the first outer layer circuit pattern in the first region by miniaturizing the outer layer circuit pattern, thereby improving product reliability. In particular, the embodiment can solve problems such as collapsing or rubbing of a trace of the first outer layer circuit pattern in the first region, thereby improving product reliability.

Meanwhile, the solder resist of the embodiment includes a first part disposed in the first region and a second part disposed in the second region. In this case, an upper surface of the first part of the embodiment may have a convex shape in an upward direction. For example, an outer region of the upper surface of the first part of the solder resist may have a fourth height, and an inner region of the upper surface of the first part of the solder resist may have a fifth height greater than the fourth height. That is, an upper surface of the first part of the solder resist may include a highest portion having a highest height and a lowest portion having a lowest height. In addition, the lowest portion may be positioned closer to the outer layer circuit pattern than the highest portion. Accordingly, in the embodiment, the upper surface of the first part of the solder resist may have a convex shape, and thus a surface area of the first part of the solder resist may be increased. Accordingly, a contact surface with a layer additionally disposed on the first part (for example, a molding layer), thereby improving bonding strength. In addition, a height of the lowest portion is smaller than a height of the first outer layer circuit pattern. Accordingly, the embodiment can prevent a portion of the first part of the solder resist from remaining on a surface of the first outer layer circuit pattern, thereby improving reliability. In addition, in the embodiment, a height of the highest portion of the first part of the solder resist is greater than a height of the first outer layer circuit pattern. Accordingly, the embodiment may allow a dam function of an adhesive member to be implemented by the first part of the solder resist, thereby improving reliability.

In addition, the circuit board in the embodiment can be applied to a 5G communication system, and accordingly, transmission loss of a high frequency can be minimized, thereby further improving the reliability. Specifically, the circuit board in the embodiment can be used at the high frequency and can reduce wave loss.

DESCRIPTION OF DRAWINGS

FIGS. 1A and 1B are views showing a circuit board manufactured by an SAP method according to a comparative example.

FIG. 2 is a view showing a circuit board manufactured by a ETS method in a comparative example.

FIG. 3 is a view showing a circuit board according to an embodiment.

FIG. 4A is an enlarged view of region B of FIG. 3.

FIG. 4B is an enlarged view of region C of FIG. 4A.

FIGS. 4C and 4D are views showing various modified examples of a protective layer of an embodiment.

FIG. 5 is a view showing a first region and a second region according to an embodiment.

FIG. 6 is a view showing a height difference of a solder resist in a second region according to an embodiment.

FIGS. 7 to 14 are views showing a method of manufacturing the circuit board according to an embodiment in order of process.

MODES OF THE INVENTION

Hereinafter, the embodiment disclosed in the present specification will be described in detail with reference to the accompanying drawings, but the same or similar components are designated by the same reference numerals regardless of drawing numbers, and repeated description thereof will be omitted. The component suffixes "module" and "part" used in the following description are given or mixed together only considering the ease of creating the specification, and have no meanings or roles that are distinguished from each other by themselves. In addition, in describing the embodiments disclosed in the present specification, when it is determined that detailed descriptions of a related well-known art unnecessarily obscure gist of the embodiments disclosed in the present specification, the detailed description thereof will be omitted. Further, the accompanying drawings are merely for facilitating understanding of the embodiments disclosed in the present specification, the technological scope disclosed in the present specification is not limited by the accompanying drawings, and it should be understood as including all modifications, equivalents and alternatives that fall within the spirit and scope of the present invention.

It will be understood that, although the terms "first," "second," etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, it will be understood that there are no intervening elements present.

As used herein, a singular expression includes a plural expression, unless the context clearly indicates otherwise.

It will be understood that the terms "comprise", "include", or "have" specify the presence of stated features, integers, steps, operations, elements, components and/or groups thereof disclosed in the present specification, but do not preclude the possibility of the presence or addition of one or more other features, integers, steps, operations, elements, components, and/or groups thereof.

Hereinafter, embodiments of the present invention will be described in detail with reference to the accompanying drawings.

Prior to descriptions of the present embodiment, a comparative example compared with the present embodiment will be described.

FIG. 1 is a view showing a circuit board according to a comparative example.

Referring to FIG. 1 (a), the circuit board according to the comparative example includes a circuit pattern manufactured by a general SAP method.

Specifically, the circuit board includes an insulating layer 10, a circuit pattern 20, and a protective layer 30.

The circuit pattern 20 is respectively disposed on upper and lower surfaces of the insulating layer 10.

In this case, at least one of the circuit patterns 20 disposed on a surface of the insulating layer 10 includes a fine circuit pattern.

In FIG. 1, the circuit pattern 20 disposed on the upper surface of the insulating layer 10 includes a fine circuit pattern. The fine circuit pattern includes a trace 21 that is a signal transmission wiring line and a pad 22 for mounting a chip and the like.

In this case, in the embodiment, since a supporting layer using a solder resist is formed for protecting the fine circuit pattern, a structure in a region where the fine circuit pattern is formed in the comparative example will be described.

In addition, a protective layer 30 for protecting the circuit pattern 20 is disposed on the surface of the insulating layer 10.

In this case, an upper region of the insulating layer 10 includes a first region where the protective layer 30 is disposed and a second region that is an open region where the protective layer 30 is not disposed.

Accordingly, a part of the circuit pattern 20 disposed on the upper surface of the insulating layer 10 is covered by the protective layer 30, and the remaining part is exposed to the outside without being covered by the protective layer 30.

In this case, the trace 21 and the pad 22 corresponding to the fine circuit pattern as described above are disposed in the second region that is the open region of the protective layer 30.

For example, at least one of the trace 21 and the pad 22 is formed in a width/interval of 15 µm/15 µm or less.

In this case, when the circuit pattern formed in the open region of the protective layer 30 is a pattern having a width exceeding 15 µm rather than a fine circuit pattern, the circuit pattern may be strong against external impact.

However, as shown in FIG. 1 (b), as the circuit pattern gradually becomes finer, the width and interval of the trace 21 and the pad 22, which are the fine circuit patterns of the outermost layer, gradually decrease, and accordingly, when the fine circuit pattern protruding above the upper surface of the insulating layer 10 is disposed in the second region that is the open region of the protective layer, there is a problem that the fine circuit pattern easily collapses due to an external impact.

That is, as in B of FIG. 1 (b), the trace 21 corresponding to the fine circuit pattern of the outermost layer has an extremely fine pattern shape, and thus a problem of easily collapsing or rubbing occurs even with a small external impact.

Meanwhile, recently, the fine circuit pattern disposed in the open region of the protective layer while having a structure buried in the insulating layer is formed by using a ETS method.

FIG. 2 is a view showing a circuit board manufactured by an ETS method in a comparative example.

Referring to FIG. 2, specifically, the circuit board includes an insulating layer 10A, a circuit pattern 20A, and a protective layer 30A.

The circuit pattern 20A is respectively disposed on upper and lower surfaces of the insulating layer 10A.

In this case, at least one of the circuit patterns 20A disposed on a surface of the insulating layer 10A includes a fine circuit pattern.

Here, when the circuit pattern is formed by the ETS method, the circuit pattern formed at first has a structure buried in the insulating layer 10A. Accordingly, when the circuit pattern formed at first is formed as a fine circuit pattern, the fine circuit pattern may have a structure in which the fine circuit pattern is buried in the insulating layer 10A even in Comparative example.

That is, the circuit board manufactured by the ETS method includes a fine circuit pattern having a structure buried in the surface of the insulating layer 10A. That is, the fine circuit pattern includes a trace 21A that is a signal transmission wiring line and a pad 22A for mounting a chip or the like.

In addition, when the circuit board is manufactured by the ETS method as described above, since the fine circuit pattern has the structure buried in the insulating layer, the fine circuit pattern may be protected from an external impact.

In this case, for a substrate having a two-layer structure (based on the number of layers of the circuit pattern) as in FIG. 2, there is no major problem in manufacturing the circuit board by the ETS method. However, in case of manufacturing a circuit board having eight or more layers, in particular, ten or more layers by the ETS method, a lead time for manufacturing the same takes at least 2 months or more, and thus there is a problem that productivity is lowered.

In addition, in order to manufacture the fine circuit pattern of the buried structure by the ETS method, the fine circuit pattern should be formed at first during a manufacturing process of a multilayer circuit board. In addition, recently, in order to be applied to an AP module having high integration/high specification, etc., a circuit board having eight to ten layers are required. In this case, in a process of forming the fine circuit pattern at first during the ETS process and then performing a multilayer stacking process, damage is applied to the fine circuit pattern due to a thermal stress, etc., and thus there is a problem that it is difficult to normally implement the fine circuit pattern.

In addition, when the circuit board is manufactured by the ETS method, an ETS core layer is separately required. In this case, when the circuit board is manufactured by the ETS method, an additional process for finally removing the ETS core layer is required.

In addition, when the circuit board is manufactured by the ETS method, there is a problem that a yield is lowered due to a cumulative tolerance when layers are stacked more than a certain number of times, and accordingly, product costs increase, and there is a problem that pattern damage increases due to stress as the stacking process is respectively performed on both surfaces around the ETS core layer.

In addition, with the development of 5G technology in recent years, interest in circuit boards that may reflect the same is increasing. In this case, in order to apply the 5G technology, the circuit board should have a high multi-layer structure, and accordingly, the circuit pattern should be made fine. However, in Comparative example, it is possible to form the fine pattern, but there is a problem that it is not possible to stably protect the fine pattern.

Accordingly, the embodiment is directed to providing a circuit board of a new structure capable of solving the reliability problem of the fine pattern disposed at the outermost portion and a control method thereof.

FIG. 3 is a view showing a circuit board according to an embodiment, FIG. 4a is an enlarged view of region B of FIG. 3, FIG. 4b is an enlarged view of region C of FIG. 4a, FIGS. 4c and 4d are views showing various modified examples of a protective layer of an embodiment, FIG. 5 is a view showing a first region and a second region according to an embodiment, and FIG. 6 is a view showing a height difference of a solder resist in a second region according to an embodiment.

Prior to descriptions of FIGS. 3 and 4, the circuit board according to the embodiment may have a multilayer structure. Preferably, the circuit board according to the embodiment may have a structure of ten or more layers based on a number of layers of the circuit pattern. However, this is merely an example and the embodiment is not limited thereto. That is, the circuit board in the embodiment may have a number of layers smaller than ten layers, or alternatively, the circuit board may have a number of layers greater than ten layers.

However, the circuit board in the embodiment is for solving problems of the ETS method in the comparative example. In this case, the ETS method in Comparative example has many problems in manufacture a circuit board having eight or more layers, and accordingly, the embodiment will be described as having a ten-layer structure for comparison therewith.

Referring to FIGS. 3, 4a and 4b, a circuit board 100 includes an insulating layer 110.

Preferably, the circuit board 100 may include first to ninth insulating layers 111, 112, 113, 114, 115, 116, 117, 118, and 119 in order to implement a ten-layer structure.

In this case, the first insulating layer 111, the second insulating layer 112, the third insulating layer 113, the fourth insulating layer 114, the fifth insulating layer 115, the sixth insulating layer 116, and the seventh insulating layer 117 of the insulating layer 110 may be an internal insulating layer disposed inside in a stacked insulating layer structure, and the eighth insulating layer 118 may be an uppermost insulating layer(a first outermost insulating layer) disposed on an inner insulating layer, and the ninth insulating layer 119 may be a lowermost insulating layer (a second outermost insulating layer) disposed under the inner insulating layer.

The first insulating layer 111 may be a core insulating layer disposed at a center in the stacked structure of the insulating layer 110. The second insulating layer 112, the fourth insulating layer 114, the sixth insulating layer 116, and the eighth insulating layer 118 may be upper insulating layers sequentially disposed on the first insulating layer 111. In addition, the third insulating layer 113, the fifth insulating layer 115, the seventh insulating layer 117, and the ninth insulating layer 119 may be lower insulating layers sequentially disposed under the first insulating layer 111.

The insulating layer 110 may be a substrate on which an electric circuit capable of changing wiring is formed and may include all of a printed circuit board, a wiring board, and an insulating substrate made of an insulating material capable of forming circuit patterns on a surface thereof.

For example, the insulating layer 110 may be rigid or flexible. For example, the insulating layer 110 may include glass or plastic. Specifically, the insulating layer 110 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

Further, the insulating layer 110 may include an optically isotropic film. As an example, the insulating layer 110 may include cyclic olefin copolymer (COC), cyclic olefin polymer (COP), optically isotropic PC, optically isotropic polymethylmethacrylate (PMMA), or the like.

In addition, at least one of the insulating layer 110 may be partially bent while having a curved surface. That is, at least one of the insulating layer 110 may partially have a plane and may partially be bent while having a curved surface. Specifically, an end portion of at least one of the insulating layer 110 may be bent while having a curved surface, or bent or crooked while having a surface with a random curvature.

In addition, at least one of the insulating layer 110 may be a flexible substrate having flexibility. Further, at least one of the insulating layer 110 may be a curved or bent substrate. In this case, at least one of the insulating layer 110 may form a wiring layout for electrical wirings which connect circuit components based on a circuit design, and electrical conductors may be disposed on an insulating material. Further, electrical components may be mounted on at least one of the insulating layer 110, and the insulating layer 110 may form wirings configured to connect the electrical components to make a circuit, and may mechanically fix the components besides functioning to electrically connect the components.

A circuit pattern may be disposed on a surface of the insulating layer 110.

That is, circuit patterns may be disposed on respective surfaces of the first to ninth insulating layers 111, 112, 113, 114, 115, 116, 117, 118, and 119 constituting the insulating layer 110.

Here, the circuit pattern may include an inner layer circuit pattern 120 and outer layer circuit patterns 130 and 140. The inner layer circuit pattern 120 may be a circuit pattern disposed inside the insulating layer 110 in the stacked structure of the circuit board, and the outer layer circuit patterns 130 and 140 may be a circuit pattern disposed on an outermost side of the insulating layer 110 in the stacked structure of the circuit board.

The inner layer circuit pattern 120 may include a first circuit pattern 121, a second circuit pattern 122, a third circuit pattern 123, a fourth circuit pattern 124, a fifth circuit pattern 125, and a sixth circuit pattern 126, and a seventh circuit pattern 127.

The first circuit pattern 121 may be disposed on an upper surface of the first insulating layer 111, and thus the first circuit pattern 121 may be covered by the second insulating layer 112. The second circuit pattern 122 may be disposed on a lower surface of the first insulating layer 111, and thus the second circuit pattern 122 may be covered by the third insulating layer 113. The third circuit pattern 123 may be disposed on an upper surface of the second insulating layer 112, and thus the third circuit pattern 123 may be covered by the fourth insulating layer 114. The fourth circuit pattern 124 may be disposed on a lower surface of the third insulating layer 113, and thus the fourth circuit pattern 124 may be covered by the fifth insulating layer 115. The fifth circuit pattern 125 may be disposed on an upper surface of the fourth insulating layer 114, and thus the fifth circuit pattern 125 may be covered by the sixth insulating layer 116. The sixth circuit pattern 126 may be disposed on a lower surface of the fifth insulating layer 115, and thus the sixth circuit pattern 126 may be covered by the seventh insulating layer 117. The seventh circuit pattern 127 may be disposed on an upper surface of the sixth insulating layer 116, and thus the seventh circuit pattern 127 may be covered by the eighth insulating layer 118. The eighth circuit pattern 128 may be disposed on a lower surface of the seventh insulating layer 117, and thus the eighth circuit pattern 128 may be covered by the ninth insulating layer 119.

The outer layer circuit pattern may be disposed on a surface of the outermost insulating layer disposed on the outermost side of the insulating layer 110. Preferably, the outer layer circuit pattern may include a lower outer layer circuit pattern 130 disposed on a lower surface of the ninth insulating layer 119 disposed at a lowermost portion of the insulating layer 110.

In addition, the outer layer circuit pattern may include an upper outer layer circuit pattern 140 disposed on an upper surface of the eighth insulating layer 118 disposed on an uppermost portion of the insulating layer 110.

In this case, at least one of the lower outer layer circuit pattern 130 and the upper outer layer circuit pattern 140 may be formed to protrude above the surface of the insulating layer. Preferably, the lower outer layer circuit pattern 130 may be formed to protrude below the lower surface of the ninth insulating layer 119. In addition, the upper outer layer circuit pattern 140 may be formed to protrude above the upper surface of the eighth insulating layer 118.

That is, an upper surface of the lower outer layer circuit pattern 130 may be positioned on the same plane as the lower surface of the ninth insulating layer 119. In addition, a lower surface of the upper outer layer circuit pattern 140 may be positioned on the same plane as an upper surface of the primer layer 150 disposed on an upper surface of the eighth insulating layer 180.

In other words, the primer layer 150 may be disposed on the upper surface of the eighth insulating layer 180 and the upper outer layer circuit pattern 140.

That is, the upper outer layer circuit pattern 140 may include a fine circuit pattern. Preferably, the upper outer layer circuit pattern 140 may be a fine circuit pattern having a line width of 10 µm or less and an interval between patterns of 10 μm or less. Accordingly, when the upper outer layer circuit pattern 140 is directly disposed on the eighth insulating layer 118, a contact area between the eighth insulating layer 118 and the upper outer layer circuit pattern 140 is small, and thus a situation in which the upper outer layer circuit pattern 150 is separated from the eighth insulating layer 118 may occur.

Therefore, in the embodiment, the primer layer 150 is disposed between the upper outer layer circuit pattern 140 and the eighth insulating layer 118. The primer layer 150 may improve bonding force between the upper outer layer circuit pattern 140 and the eighth insulating layer 118. The primer layer 150 may be disposed to entirely cover the upper surface of the eighth insulating layer 118. In addition, the upper outer layer circuit pattern 140 may be partially disposed on the primer layer 150. Therefore, the upper surface of the primer layer 150 in an embodiment may include a first portion in contact with the upper outer layer circuit pattern 140 and a second portion in contact with a lower surface of a solder resist 160 to be described later. That is, when the upper outer layer circuit pattern 140 by the SAP process is formed, the primer layer 150 may serve to strengthen bonding force between the eighth insulating layer 118 and the upper outer layer circuit pattern 140. Such a primer layer 150 may include a polyurethane-based resin, an acrylic resin, or a silicone-based resin, but the embodiment is not limited thereto.

Meanwhile, it is illustrated in FIG. 3 that the primer layer is not disposed between the ninth insulating layer 119 and the lower outer layer circuit pattern 130, but the primer layer may also be formed between the ninth insulating layer 119 and the lower outer layer circuit pattern 130. However, the lower outer layer circuit pattern 130 may not be the fine circuit pattern, and accordingly, the primer layer between the ninth insulating layer 119 and the lower outer layer circuit pattern 130 may be selectively omitted.

Consequently, when the fine circuit pattern is disposed on the inner layer, the primer layer may be omitted as the circuit pattern is covered by at least one of the insulating layers 110. On the other hand, in the embodiment, when the fine circuit pattern is disposed on the outermost layer, since there is no insulating layer covering the fine circuit pattern, the primer layer 150 is disposed in order to improve bonding force between the fine circuit pattern and the insulating layer.

Hereinafter, it will be described that the upper outer layer circuit pattern 140 is formed of a fine circuit pattern. However, the embodiment is not limited thereto, and the lower outer layer circuit pattern 130 may also be formed of the fine circuit pattern. It will be obvious that a structure for improving reliability, such as strengthening bonding force and preventing collapse of the upper outer layer circuit pattern 140 described below, may also be applied to the lower outer layer circuit pattern 130.

The inner layer circuit pattern 120, the lower outer layer circuit pattern 130, and the upper outer layer circuit pattern 140 may be wirings that transmit electrical signals and may be formed of a metal material having high electrical conductivity. To this end, the inner circuit pattern 120, the lower outer layer circuit pattern 130, and the upper outer layer circuit pattern 140 may be formed of at least one metal material selected from among gold (Au), silver (Ag), platinum (Pt), titanium (Ti), tin (Sn), copper (Cu), and zinc (Zn). In addition, the inner circuit pattern 120, the lower outer layer circuit pattern 130, and the upper outer layer circuit pattern 140 may be formed of paste or solder paste including at least one metal material selected from among gold (Au), silver (Ag), platinum (Pt), titanium (Ti), tin (Sn), copper (Cu), and zinc (Zn), which are excellent in bonding force. Preferably, the inner circuit pattern 120, the lower outer layer circuit pattern 130, and the upper outer layer circuit pattern 140 may be formed of copper (Cu) having high electrical conductivity and a relatively low cost.

At least one of the inner layer circuit pattern 120, the lower outer layer circuit pattern 130, and the upper outer layer circuit pattern 140 may be formed by a general process of manufacturing a circuit board, such as an additive process, a subtractive process, a modified semi additive process (MSAP), a semi additive process (SAP), etc., and detailed descriptions thereof will be omitted herein.

Preferably, the lower outer layer circuit pattern 130 and the upper outer layer circuit pattern 140 are outermost circuit patterns disposed on an outermost side of the circuit board, and thus they may be formed by the SAP (Semi Additive Process) method.

Meanwhile, a via V may be disposed in the insulating layer 110. The vias V are disposed in each insulating layer, and thus the via V may serve to electrically connect circuit patterns disposed in different layers to each other.

A first via V1 may be disposed in the first insulating layer 111. The first via V1 may electrically connect the first circuit pattern 121 disposed on the upper surface of the first insulating layer 111 and the second circuit pattern 122 disposed on the lower surface of the first insulating layer 111.

A second via V2 may be disposed in the second insulating layer 112. The second via V2 may electrically connect the first circuit pattern 121 disposed on the upper surface of the first insulating layer 111 and the third circuit pattern 123 disposed on the upper surface of the second insulating layer 112.

A third via V3 may be disposed in the third insulating layer 113. The third via V3 may electrically connect the second circuit pattern 122 disposed on the lower surface of the first insulating layer 111 and the fourth circuit pattern 124 disposed on the lower surface of the third insulating layer 113.

A fourth via V4 may be disposed in the fourth insulating layer 114. The fourth via V4 may electrically connect the third circuit pattern 123 disposed on the upper surface of the second insulating layer 111 and the fifth circuit pattern 125 disposed on the upper surface of the fourth insulating layer 114.

A fifth via V5 may be disposed in the fifth insulating layer 115. The fifth via V5 may electrically connect the fourth circuit pattern 124 disposed on the lower surface of the third insulating layer 113 and the sixth circuit pattern 126 disposed on the lower surface of the fifth insulating layer 115.

A sixth via V6 may be disposed in the sixth insulating layer 116. The sixth via V6 may electrically connect the fifth circuit pattern 125 disposed on the upper surface of the fourth insulating layer 114 and the seventh circuit pattern 127 disposed on the upper surface of the sixth insulating layer 116.

A seventh via V7 may be disposed in the seventh insulating layer 117. The seventh via V7 may electrically connect the sixth circuit pattern 126 disposed on the lower surface of the fifth insulating layer 115 and the eighth circuit pattern 128 disposed on the lower surface of the seventh insulating layer 117.

An eighth via V1 may be disposed in the eighth insulating layer 118. The eighth via V8 may electrically connect the seventh circuit pattern 127 disposed on the upper surface of the sixth insulating layer 116 and the upper outer layer circuit pattern 140 disposed on the upper surface of the primer layer 150.

A ninth via V9 may be disposed in the ninth insulating layer 119. The ninth via V9 may electrically connect the eighth circuit pattern 128 disposed on the lower surface of the seventh insulating layer 117 and the lower outer layer circuit pattern 130 disposed on the lower surface of the ninth insulating layer 119.

The via V as described above may be formed by filling the inside of a via hole formed in each insulating layer with a metal material.

The via hole may be formed by any one of mechanical, laser, and chemical processing method. When the via hole is formed by mechanical processing, a method such as milling, drilling and routing may be used, when the via hole is formed by laser processing, a method of UV or $CO_2$ laser may be used, and when the via hole is formed by chemical processing, the insulating layer 110 may be opened using a chemical including aminosilane, ketone, or the like.

Meanwhile, the laser processing is a cutting method in which a part of a material is melted and evaporated by concentrating optical energy at a surface to take a desired shape. Complex formation by a computer program may be easily processed, and composite materials which are difficult to cut by other methods may be processed.

In addition, the processing by the laser may have a cutting diameter of at least 0.005 mm, and has a wide range of thickness that may be processed.

It is preferable to use an yttrium aluminum garnet (YAG) laser or $CO_2$ laser or ultraviolet (UV) laser as the laser processing drill. The YAG laser is a laser capable of processing both a copper foil layer and an insulating layer, and the $CO_2$ laser is a laser capable of processing only an insulating layer.

When the via hole is formed, the first to ninth vias V1, V2, V3, V4, V5, V6, V7, V8, and V9 may be formed by filling the inside of the via hole with a conductive material. The metal material forming the first to ninth vias V1, V2, V3, V4, V5, V6, V7, V8, and V9 may be any one material selected from among copper (Cu), silver (Ag), tin (Sn), gold (Au), nickel (Ni), and palladium (Pd), and the conductive material may be filled by any one of electroless plating, electrolytic plating, screen printing, sputtering, evaporation, ink jetting, and dispensing, or a combination thereof.

Meanwhile, a protective layer may be disposed on an outermost side of the circuit board 100. Preferably, a first protective layer 160 may be disposed on the eighth insulating layer 118 (preferably, on the primer layer 150). In addition, a second protective layer 175 may be disposed under the ninth insulating layer 119.

The first protective layer 160 and the second protective layer 175 may be formed of at least one layer using any one or more of solder resist (SR), oxide, and Au. Preferably, the first protective layer 160 and the second protective layer 175 may be a solder resist.

Meanwhile, the first protective layer 160 is disposed on the primer layer 150. The first protective layer 160 may serve to support the upper outer layer circuit pattern 140 disposed on the primer layer 150 and protect a surface of the upper outer layer circuit pattern 140.

That is, the first protective layer 160 may partially overlap the upper outer layer circuit pattern 140 disposed on the primer layer 150. An area of the first protective layer 160 may be smaller than an area of the eighth insulating layer 118. The area of the first protective layer 160 may be smaller than an area of the primer layer 150. The first protective layer 160 is partially or entirely disposed on the primer layer 150 and the upper outer layer circuit pattern 140, and thus the first protective layer 170 may include an open region exposing a surface of the upper outer layer circuit pattern 140.

Specifically, the first protective layer 160 includes a hole-shaped open region. That is, the open region of the first protective layer 160 may vertically overlap the first region R1 to expose the first region R1.

The first region R1 may be a region (i.e., the open region of the first protective layer) where the first protective layer 160 is not disposed among upper regions of the primer layer 150 and the second outer layer circuit pattern 140.

That is, the first region R1 may be the non-disposed region of the first protective layer 160 for electrically connecting the upper outer layer circuit pattern 140 to a component such as a chip. Accordingly, the upper outer layer circuit pattern 140 disposed on the first region R1 may be exposed to the outside in a state in which the protective layer protecting the same does not exist.

Specifically, the upper circuit pattern 140 includes a device mounting pad on which a chip device is mounted, a core pad or a BGA pad to serve as a die for connection to an external board, a trace as signal transmission wiring, and is disposed on the first region R1. In addition, the first protective layer 160 has an open region exposing a surface of the upper outer layer circuit pattern 140 corresponding to the device mounting pad, the core pad, and the BGA pad in the first region R1.

That is, the circuit board includes a first region R1 and a second region R2. The first region R1 is an open region where the surface of the upper outer layer circuit pattern 140 should be exposed through the first protective layer 160, and the second region R2 may be a buried region where the surface of the upper outer layer circuit pattern 140 is covered by the first protective layer 160.

The first region R1 is a region where a first pad 142 to be electrically connected to a component such as a chip, a trace 141, and a second pad (not shown) corresponding to a core pad or a BGA pad functioning as a die for bonding to an external board among the upper outer layer circuit pattern 140.

In addition, the upper outer layer circuit pattern 140 disposed in the first region R1 as described above may have a reliability problem such as collapsing or rubbing due to various factors. Furthermore, the trace 141 of the upper outer layer circuit pattern 140 is a fine circuit pattern, and thus the second outer layer circuit pattern 140 has a line width of 10 µm or less and an interval of 10 µm or less and is disposed on the primer layer 150. Accordingly, the trace 141 disposed on the first region R1 may have a problem that it is easily collapsed or rubbed by various small external impacts.

Accordingly, in the embodiment, in order to improve reliability of the upper outer layer circuit pattern 140 disposed on the first region R1, the first protective layer 160 is formed on the primer layer 150 corresponding to the first region R1.

That is, the first protective layer 160 may be disposed in a region of the upper surface of the primer layer 150 where the upper outer layer circuit pattern 140 is not disposed. For example, the first protective layer 160 may be disposed on the upper surface of the primer layer 150, and thus the first protective layer 160 may be disposed between the upper outer layer circuit patterns 140 on the first region R1.

In this case, the upper outer layer circuit pattern 140 includes a first outer layer circuit pattern formed in the first region R1 and a second upper outer layer circuit pattern formed in the second region R2.

In addition, an upper surface of the primer layer 150 may include a first upper surface corresponding to the first region R1 and a second upper surface corresponding to the second region R2.

In this case, the first protective layer 160 may be entirely disposed on the primer layer 150 without dividing the first region R1 and the second region R2. That is, the first protective layer 160 may be respectively disposed in a region between the first outer layer circuit patterns and a region between the second outer layer circuit patterns.

Accordingly, the first protective layer 160 includes a first part disposed in the first region R1 and a second part disposed in the second region R2.

In this case, the first protective layer 160 may have different heights for each region.

A surface of the upper outer layer circuit pattern 140 should be exposed to an outside in the first region R1, and a surface of the upper outer layer circuit pattern 140 should be covered with a protective layer in the second region R2.

The first protective layer 160 may include a first part disposed in the first region R1 and a second part disposed in the second region R2. In addition, the first part and the second part may have different heights.

For example, an upper surface of the first part disposed in the first region R1 may be positioned lower than an upper surface of the second part disposed in the second region R2.

In addition, an upper surface of the second part may be positioned higher than an upper surface of the first part.

In this case, an upper surface of the first protective layer 160 may have a curve.

For example, the upper surface of the first protective layer 160 may have a concave shape toward a downward direction in a region vertically overlapping the upper outer layer circuit pattern 140. For example, an upper surface of the first protective layer 160 may have a concave shape toward an upward direction in a region that does not overlap with the upper outer layer circuit pattern 140 in a vertical direction.

In other words, a height of the upper surface of the first protective layer 160 in a region overlapping the upper outer layer circuit pattern 140 may be smaller than a height in a region not overlapping the upper outer layer circuit pattern 140.

In this case, the first protective layer 160 includes a first part disposed in the first region R1 and a second part disposed in the second region R2. In addition, the first part of the first protective layer 160 exposes the first outer layer circuit pattern. Accordingly, the first part of the first protective layer 160 may be selectively disposed in a region that does not overlap with the first outer layer circuit pattern in the vertical direction. Accordingly, the first part of the first protective layer 160 may have a shape in which an upper surface is convex toward an upward direction. For example, the first part of the first protective layer 160 may be disposed between a plurality of adjacent first outer layer circuit patterns among a plurality of first outer layer circuit patterns.

Meanwhile, the second part of the first protective layer 160 covers the second outer layer circuit pattern. Accordingly, the second part of the first protective layer 160 includes a 2-1 part disposed in a region vertically overlapping the second outer layer circuit pattern 140, and a 2-2 part other than the 2-1 part. In addition, the 2-1 part of the first protective layer 160 may have a concave shape toward a downward direction. In addition, the 2-2 part of the first protective layer 160 may have a convex shape toward an upward direction.

Hereinafter, the first protective layer 160 will be described in detail.

The first protective layer 160 may be disposed on the primer layer 150. The first protective layer 160 is a solder resist.

The first protective layer 160 may be disposed between the upper outer layer circuit patterns 140 on the primer layer 150. That is, the upper outer layer circuit patterns 140 are disposed on the primer layer 150 at regular intervals. Also, the first protective layer 160 may be disposed on a region of an upper surface of the primer layer 150 where the upper outer layer circuit pattern 140 is not disposed. In addition, the first protective layer 160 may be selectively disposed on the upper outer layer circuit pattern 140.

Hereinafter, the first protective layer 160 will be described as a solder resist 160.

A solder resist 160 may be disposed on a region of the upper surface of the primer layer 150 where the upper outer layer circuit pattern 140 is not disposed.

Accordingly, a lower surface of the solder resist 160 may directly contact the upper surface of the primer layer 150. In addition, the solder resist 160 may have a structure in direct contact with the upper outer layer circuit pattern 140.

For example, the first part of the solder resist 160 disposed in the first region R1 may directly contact a part of a side surface of the upper outer layer circuit pattern 140.

In addition, the second part of the solder resist 160 disposed in the second region R2 may directly contact the side surface of the upper outer layer circuit pattern 140. In addition, the second part of the solder resist 160 disposed in the second region R2 may directly contact an upper surface of the upper outer layer circuit pattern 140. That is, the second part of the solder resist 160 disposed in the second region R2 protrudes over the upper surface of the upper outer layer circuit pattern 140 with a predetermined height, and the second part of the solder resist 160 may be disposed to cover the upper outer layer circuit pattern 140. In detail, the second part of the solder resist 160 disposed in the second region R2 may be disposed while surrounding the side surface and upper surface of the upper outer layer circuit pattern 140.

In this case, the solder resist 160 may have different heights for each part. Here, a height of each part of the solder resist 160 may be determined by a height of the upper outer layer circuit pattern 140.

The upper outer layer circuit pattern 140 may be disposed on the insulating layer 110 with a first height H1. In this case, the insulating layer 110 may mean an insulating layer disposed on an uppermost side of a plurality of insulating layers. However, hereinafter, it will be described as the insulating layer 110 for convenience of description. Meanwhile, a primer layer 150 may be disposed between the insulating layer 110 and the upper outer layer circuit pattern 140. In this case, the upper outer layer circuit pattern 140 may be disposed on the primer layer 150 with a first height H1. In addition, 'height' described below may correspond to 'thickness'.

The first height H1 of the upper outer layer circuit pattern 140 may be 12 μm±2 μm. For example, the first height H1 of the upper outer layer circuit pattern 140 may range from 10 μm to 14 μm.

The second part of the solder resist 160 may be disposed on the upper outer layer circuit pattern 140 with a predetermined height. In this case, the second part of the solder resist 160 may have different heights depending on positions. That is, the upper surface of the second part of the solder resist 160 may be a curved surface, a rounded surface, or a concavo-convex surface rather than a flat surface.

In this case, the second part of the solder resist 160 is disposed to cover the upper outer layer circuit pattern 140 in order to stably protect the upper outer layer circuit pattern 140. In this case, a height of the second part of the solder resist 160 may be 7 μm to 17 μm. When the height of the second part of the solder resist 160 is smaller than 7 μm, the upper outer layer circuit pattern 140 buried in the second part of the solder resist 160 cannot be stably protected from various factors. In addition, when the height of the second part of the solder resist 160 is greater than 17 μm, an overall thickness of the circuit board may increase. In addition, when the height of the second part is greater than 17 μm, a manufacturing cost of the circuit board may increase.

In this case, as described above, the second part of the solder resist 160 includes a 2-1 part and a 2-2 part. In this case, a highest portion 160-2 of the 2-1 part of the solder resist 160 may have a second height H2. In addition, a lowest portion 160-1 of the 2-2 part of the solder resist 160 may have a third height H3. In this case, each of the second height H2 and the third height H3 may have a range of 7 μm to 17 μm.

Meanwhile, a difference value ΔH between the second height H2 and the third height H3 may range from 1 μm to 7 μm. For example, the third height H3 may have a range between 80% and 97% of the second height H2. For example, the third height H3 may have a range between 85% and 95% of the second height H2. The third height H3 may have a range between 88% and 92% of the second height H2.

Meanwhile, the first part of the solder resist 160 may be disposed in the first region R1. Preferably, the first part of the solder resist 160 may be disposed between the first outer layer circuit patterns positioned in the first region R1 of the upper outer layer circuit patterns 140.

In this case, an upper surface of the first part of the solder resist 160 may have a convex shape toward an upward direction. That is, as shown in FIG. 4b, a part of the upper surface of the first part of the solder resist 160 may be positioned higher than the upper surface of the first outer layer circuit pattern. In addition, a part of the upper surface of the solder resist 160 may be positioned lower than the upper surface of the first outer layer circuit pattern. For example, a lowest portion of the upper surface of the first part of the solder resist 160 may have a fourth height H4 smaller than the first height H1. For example, the highest portion of the upper surface of the first part of the solder resist 160 may have a fifth height H5 greater than the first height H1. In this case, the fourth height H4 may be 70% to 95% of the first height H1. For example, the fourth height H4 may be 75% to 90% of the first height H1. In this case, the fourth height H4 may be 75% to 88% of the first height H1. When the fourth height H4 is smaller than 70% of the first height H1, the first outer layer circuit pattern may not be stably supported by the first part. When the fourth height H4 is greater than 95% of the first height H1, a part of the solder resist may remain on the surface of the first outer layer circuit pattern, and thus a reliability problem may occur.

Meanwhile, the fifth height H5 may be 102% to 120% of the first height H1. The fifth height H5 may be 105% to 118% of the first height H1. The fifth height H5 may be 108% to 115% of the first height H1. When the fifth height H5 is smaller than 102% of the first height H1, a dam function of the first part, which will be described later, cannot be implemented. In addition, when the fifth height H5 is greater than 120% of the first height H1, the fourth height H4 increases. Accordingly, the solder resist 160 may remain on the surface of the first outer layer circuit pattern, and thus a reliability problem may occur. Meanwhile, the fourth height H4 may be a height of a part of the upper surface of the first part of the solder resist 160 positioned in an edge region. For example, the fourth height H4 may be a height of an edge portion of the first part of the solder resist 160. That is, the height of the upper surface of the first part of the solder resist 160 may decrease as it approaches the first outer layer circuit pattern, and the height of the upper surface of the first part of the solder resist 160 may increase as it the distance from the first outer layer circuit pattern increases. Accordingly, the solder resist 160 may have a highest fifth height H5 in the central region of the upper surface of the first part, but is not limited thereto. However, the lowest portion of the second part of the solder resist 160 having the fourth height H4 may be positioned adjacent to the first outer layer circuit pattern compared to the highest portion.

Meanwhile, a difference value between the fourth height H4 and the fifth height H5 may have a range of 1 μm to 7 μm. For example, the fourth height H4 may have a range of 80% to 97% of the fifth height H5. For example, the fourth height H4 may have a range of 85% to 95% of the fifth height H5. The fourth height H4 may have a range of 88% to 92% of the fifth height H5.

Meanwhile, a photo solder resist film may be used as the solder resist 160. The solder resist 160 may have a structure in which a resin and a filler are mixed.

For example, the solder resist 160 may include a filler such as $BaSO_4$, $SiO_2$, or Talc, and a content of the filler may have a range of 20 wt. % to 35 wt. %.

In this case, when the content of the filler included in the solder resist 160 is less than 20 wt. %, the upper outer layer circuit pattern 140 may not be stably protected by the solder resist 160. In addition, when the content of the filler included in the solder resist 160 is greater than 35 wt. %, a part of the filler may remain on the upper outer layer circuit pattern 140 during development of the solder resist 160, and accordingly, a reliability problem occurs or a process of removing the filler must be additionally performed.

Meanwhile, an upper surface of the second part of the solder resist 160 in the embodiment is a portion that is not exposed and developed.

In addition, the upper surface of the first part of the solder resist 160 is a portion exposed and developed.

Accordingly, a portion of the filler may be exposed on the upper surface of the first part of the solder resist 160. However, the filler may not be directly exposed to the upper surface of the second part of the solder resist 160.

Accordingly, a surface roughness of the first part of the solder resist 160 may be different from a surface roughness of the second part of the solder resist 160. For example, a surface roughness of the first part may be greater than a surface roughness of the second part of the solder resist 160.

Meanwhile, as described above, the first outer layer circuit pattern includes a pad. Also, an adhesive member such as a solder ball for device mounting is disposed on the pad. In this case, in the embodiment, a part of the upper surface of the first part of the solder resist 160 is positioned higher than the upper surface of the first outer layer circuit pattern. Accordingly, the first part of the solder resist 160 may function to support the first outer layer circuit pattern disposed in the first region, and the first part of the solder resist 160 may function as a dam to fix the position of an adhesive member disposed on the first outer layer circuit pattern.

Meanwhile, as shown in FIG. 4c, heights of the highest portion and the lowest portion of the solder resist 160a may be selectively changed.

That is, a height of the lowest portion of the solder resist 160a may have a 4' height H4' equal to a height H1 of the first outer layer circuit pattern. In addition, a height of the highest portion of the solder resist 160a may have a 5' height H5' greater than a height H1 of the first outer layer circuit pattern. However, since the height of the lowest portion is equal to the first height H1 as described above, solder resist may remain on the first outer layer circuit pattern, and thus an additional process of removing the solder resist may be required.

As shown in FIG. 4d, the height of the highest and lowest portions of the solder resist 160b may be selectively changed.

That is, a height of the lowest portion of the solder resist 160b may have a fourth "height H4" smaller than a height H1 of the first outer layer circuit pattern. In addition, a height of the highest portion of the solder resist 160b may have a fifth "height H5" smaller than a height H1 of the first outer layer circuit pattern. However, as described above, when the fifth "height H5" of the highest portion is smaller than the first height H1, the fourth "height H4" also decreases correspondingly, and accordingly, a problem may occur in the support function in the embodiment. In addition, when the fifth "height H5" of the highest portion is smaller than the first height H1 as described above, the dam function of the adhesive member disposed on the first outer layer circuit pattern cannot be implemented, and accordingly, a reliability problem may occur in that the position of the adhesive member is changed in a state in which it is disposed.

Therefore, in the embodiment, as shown in FIG. 4b, the height of the highest portion of the solder resist 160 is greater than the height of the first outer layer circuit pattern, and the height of the lowest portion of the solder resist 160 is smaller than the height of the first outer layer circuit pattern.

A circuit board in the embodiment is a circuit board having a structure of multi-layers with eight or more layers and includes an outer layer circuit pattern disposed on an outer insulating layer positioned at an uppermost portion among the multi-layers and protruding above a surface of the outer insulating layer. In this case, the outer layer circuit pattern includes a first outer layer circuit pattern disposed in a first region that is an open region where the solder resist is not disposed, and a second outer layer circuit pattern positioned in a second region where the solder resist is disposed. In this case, the second outer layer circuit pattern may be supported and protected by the solder resist, but the first outer layer circuit pattern does not have a support layer capable of supporting the first outer layer circuit pattern, and thus there is a problem that the first outer layer circuit pattern may easily collapse due to various factors.

Accordingly, the embodiment allows remaining without removing all of the solder resist in the first region, and accordingly, the first outer layer circuit pattern can be supported and protected by the solder resist. According to this, the embodiment can solve problems such as collapsing or rubbing of the first outer layer circuit pattern in the first region by miniaturizing the outer layer circuit pattern, thereby improving product reliability. In particular, the embodiment can solve problems such as collapsing or rubbing of a trace of the first outer layer circuit pattern in the first region, thereby improving product reliability.

Meanwhile, the solder resist of the embodiment includes a first part disposed in the first region and a second part disposed in the second region. In this case, an upper surface of the first part of the embodiment may have a convex shape in an upward direction. For example, an outer region of the upper surface of the first part of the solder resist may have a fourth height, and an inner region of the upper surface of the first part of the solder resist may have a fifth height greater than the fourth height. That is, an upper surface of the first part of the solder resist may include a highest portion having a highest height and a lowest portion having a lowest height. In addition, the lowest portion may be positioned closer to the outer layer circuit pattern than the highest portion. Accordingly, in the embodiment, the upper surface of the first part of the solder resist may have a convex shape, and thus a surface area of the first part of the solder resist may be increased. Accordingly, a contact surface with a layer additionally disposed on the first part (for example, a molding layer), thereby improving bonding strength. In addition, a height of the lowest portion is smaller than a height of the first outer layer circuit pattern. Accordingly, the embodiment can prevent a portion of the first part of the solder resist from remaining on a surface of the first outer layer circuit pattern, thereby improving reliability. In addition, in the embodiment, a height of the highest portion of the first part of the solder resist is greater than a height of the first outer layer circuit pattern. Accordingly, the embodiment may allow a dam function of an adhesive member to be implemented by the first part of the solder resist, thereby improving reliability.

In addition, the circuit board in the embodiment can be applied to a 5G communication system, and accordingly, transmission loss of a high frequency can be minimized, thereby further improving the reliability. Specifically, the circuit board in the embodiment can be used at the high frequency and can reduce wave loss.

Meanwhile, in the embodiment, in forming the solder resist 160 as described above, various methods may be used to remove a portion of the solder resist 160 from the first region R1. For example, a part of the solder resist 160 may be removed by a physical process or a chemical process. For example, the solder resist 160 may be removed by a process such as plasma or sand blasting.

However, when the solder resist 160 is removed by the physical process or the chemical process, the upper outer layer circuit pattern 140 is also removed during the physical process or the chemical process, so that the upper outer layer circuit pattern 140 is deformed. For example, a cross section of the upper outer layer circuit pattern 140 may have a triangular shape, because a portion thereof is removed together during the removal of the solder resist 160. In addition, when an upper portion of the upper outer layer circuit pattern 140 has a triangular shape, an adhesive member such as a solder ball cannot be stably seated on the upper outer layer circuit pattern 140, which may cause a reliability problem. In addition, expensive equipment is required to remove the protective layer by the physical or chemical process, which may increase manufacturing cost.

On the other hand, in the embodiment, the solder resist 160 may be removed to have a desired height for each region by applying a thinning process through exposure and development processes. Also, during the exposure and development processes, deformation of the upper outer layer circuit pattern 140 does not occur, and the cross-sectional shape of the upper outer layer circuit pattern 140 may maintain a rectangular shape.

FIGS. 7 to 14 are views showing a method of manufacturing the circuit board according to an embodiment in order of process.

Referring to FIG. 7, in the embodiment, first, a process of manufacturing an inner substrate 100-1 for manufacturing an inner portion of the circuit board 100 may be performed.

The process for manufacturing the inner layer substrate 100-1 will be briefly described.

The inner layer substrate 100-1 may include one insulating layer, or alternatively, a plurality of insulating layers.

It is illustrated in FIG. 7 that the inner-layer substrate 100-1 has an insulating layer structure with seven layers, but the embodiment is not limited thereto. For example, the inner layer substrate 100-1 may include an insulating layer less than seven layers, or alternatively, more than seven layers.

The inner layer substrate 100-1 may include remaining insulating layers excluding an insulating layer disposed on an outermost layer of the circuit board 100. For example, the inner layer substrate 100-1 may include an insulating layer disposed on an uppermost portion of the circuit board 100 and remaining insulating layers excluding an insulating layer disposed on a lowermost portion of the circuit board 100.

Briefly describing the process of manufacturing the inner layer substrate 100-1, first, the first insulating layer 111 is prepared.

Then, when the first insulating layer 111 is prepared, a first via V1 is formed in the first insulating layer 111, and a circuit pattern 121 and a second circuit pattern 122 are formed on upper and lower surfaces of the first insulating layer 111, respectively.

Thereafter, a second insulating layer 112 is formed on the first insulating layer 111, and a third insulating layer 113 is formed under the first insulating layer 111.

Next, a second via V2 is formed in the second insulating layer 112, and a third circuit pattern 123 is formed on an upper surface of the second insulating layer 112. In addition, a third via V3 is formed in the third insulating layer 113, and a fourth circuit pattern 124 is formed under a lower surface of the third insulating layer 113.

Thereafter, a fourth insulating layer 114 is formed on the second insulating layer 112, and a fifth insulating layer 115 is formed under the third insulating layer 113.

Next, a fourth via V4 is formed in the fourth insulating layer 114, and a fifth circuit pattern 125 is formed on an upper surface of the fourth insulating layer 114. In addition, a fifth via V5 is formed in the fifth insulating layer 115, and a sixth circuit pattern 126 is formed under a lower surface of the fifth insulating layer 115.

Thereafter, a sixth insulating layer 116 is formed on the fourth insulating layer 114, and a seventh insulating layer 117 is formed under the fifth insulating layer 115.

Next, a sixth via V6 is formed in the sixth insulating layer 116, and a seventh circuit pattern 127 is formed on an upper surface of the sixth insulating layer 116. In addition, a seventh via V7 is formed in the seventh insulating layer 117, and an eighth circuit pattern 128 is formed under a lower surface of the seventh insulating layer 117.

Since the process of manufacturing the inner layer substrate 100-1 is a known technique in a technical field to which the present invention pertains, a detailed description thereof will be omitted.

Referring to FIG. 8, when the inner layer substrate 100-1 is manufactured, an eighth insulating layer 118 corresponding to a first outermost insulating layer is formed on an upper surface of the inner layer substrate 100-1. In addition, a ninth insulating layer 119 corresponding to a second outermost insulating layer is formed under a lower surface of the inner layer substrate 100-1.

In this case, when the eighth insulating layer 118 and the ninth insulating layer 119 are stacked, a primer layer 150 may be respectively disposed on the upper surface of the eighth insulating layer 118 and the lower surface of the ninth insulating layer 119, and a metal layer 155 may be disposed on the primer layer 150. The metal layer 155 may serve to planarize the eighth insulating layer 118 and the ninth insulating layer 119 to have uniform heights. For example, the metal layer 155 may be disposed in order to improve stacking reliability of the eighth insulating layer 118 and the ninth insulating layer 119.

The primer layer 150 may serve to increase bonding force between a lower outer layer circuit pattern 130 and a upper outer layer circuit pattern 140 that are disposed on and under the eighth insulating layer 118 and the ninth insulating layer 119, respectively. That is, when the lower outer layer circuit pattern 130 and the upper outer layer circuit pattern 140 are disposed without the primer layer 150, the bonding force between the eighth insulating layer 118 and the upper outer layer circuit pattern 140 is low, and thus they may be separated from each other.

Meanwhile, it is illustrated in FIG. 8 that the primer layer 150 is respectively disposed on the upper surface of the eighth insulating layer 118 and the lower surface of the ninth insulating layer 119, but the embodiment is not limited thereto. For example, the primer layer 150 may be selectively disposed on a surface of an insulating layer on which a fine circuit pattern is to be disposed. That is, when only the lower outer layer circuit pattern 130 is a fine circuit pattern, the primer layer 150 may be disposed only on the lower surface of the ninth insulating layer 119. In addition, when only the upper outer layer circuit pattern 140 is a fine circuit pattern, the primer layer 150 may be disposed only on the upper surface of the eighth insulating layer 118. In addition, when the lower outer layer circuit pattern 130 and the upper outer layer circuit pattern 140 are both fine circuit patterns, the primer layer 150 may be disposed on both the upper surface of the eighth insulating layer 118 and the lower surface of the ninth insulating layer 119.

Referring to FIG. 9, when the eighth insulating layer 118 and the ninth insulating layer 119 are disposed, a via hole VH is respectively formed in the eighth insulating layer 118 and the ninth insulating layer 119. In this case, the via hole VH may be respectively formed not only in the eighth insulating layer 118 and the ninth insulating layer 119 but also in the primer layer 150 and the metal layer 155.

Next, referring to FIG. 10, when the via hole VH is formed, an etching process of removing the metal layer 155 disposed on the primer layer 150 may be performed. For example, after the via hole VH is formed, a flash etching process may be performed to remove the metal layer 155, and thus a process for exposing a surface of the primer layer 150 may be performed.

Next, referring to FIG. 11, a via V forming process for filling the via hole VH may be performed, and thus the upper outer layer circuit pattern 140 may be formed on the upper surface of the eighth insulating layer 118, and the lower outer layer circuit pattern 130 may be formed on the lower surface of the ninth insulating layer 119. In this case, in the embodiment, it is illustrated that the lower outer layer circuit pattern 130 is a general circuit pattern rather than a fine circuit pattern, but the embodiment is not limited thereto, and the lower outer layer circuit pattern 130 together with the second outer layer circuit pattern may be a fine circuit pattern. Accordingly, when the lower outer layer circuit pattern 130 is a general circuit pattern, the primer layer 150 between the ninth insulating layer 119 and the lower outer layer circuit pattern 130 may be omitted.

An upper outer layer circuit pattern 140 is disposed on the upper surface of the eighth insulating layer 118. In this case, the upper outer layer circuit pattern 140 disposed on the upper surface of the eighth insulating layer 118 includes a portion disposed in the open region R1 of the first protective layer 160 and a portion disposed in an arrangement region R3 of the first protective layer 160. In addition, traces and pads, which are wiring lines for signal transmission, may be disposed in each of the regions R1 and R2.

In detail, the trace 141 and the first pad 142 may be disposed in the first region R1. The first pad 142 may be a mounting pad on which a device is mounted. In addition, a second pad (not shown) may be disposed in the first region R1. The second pad may be a BGA pad or a core pad. In particular, the second pad may have a greater width than the first pad 142.

Next, in the embodiment, a solder resist 160 (first protective layer) is disposed on the primer layer 150 to cover the upper outer layer circuit pattern 140. In this case, the solder resist layer may be disposed in both the first region R1 and the second region R2 and may be formed to have a height greater than that of the upper outer layer circuit pattern 140.

Specifically, the upper outer layer circuit pattern 140 may be disposed on the insulating layer 110 with a first height H1. In this case, the insulating layer 110 may mean an insulating layer disposed on an uppermost side of a plurality of insulating layers. However, hereinafter, it will be described as the insulating layer 110 for convenience of description. Meanwhile, a primer layer 150 may be disposed between the insulating layer 110 and the upper outer layer circuit pattern 140. In this case, the upper outer layer circuit pattern 140 may be disposed on the primer layer 150 with a first height H1. In addition, 'height' described below may correspond to 'thickness'.

The first height H1 of the upper outer layer circuit pattern 140 may be 12 μm±2 μm. For example, the first height H1 of the upper outer layer circuit pattern 140 may range from 10 μm to 14 μm.

The solder resist 160 may be disposed on the upper outer layer circuit pattern 140 with a predetermined height.

In this case, the solder resist 160 is disposed to cover the upper outer layer circuit pattern 140 in order to stably protect the upper outer layer circuit pattern 140. In this case, a height of the solder resist 160 may be 7 μm to 17 μm. When the height of the solder resist 160 is smaller than 7 μm, the upper outer layer circuit pattern 140 buried in the solder resist 160 cannot be stably protected from various factors. In addition, when the height of the solder resist 160 is greater than 17 μm, an overall thickness of the circuit board may increase. In addition, when the height of the solder resist 160 is greater than 17 μm, a manufacturing cost of the circuit board may increase.

Meanwhile, the solder resist 160 may have different heights depending on positions.

That is, the solder resist 160 may be divided into a first portion disposed on the upper outer layer circuit pattern 140 and a second portion disposed on the primer layer 150. An upper surface of the first portion of the solder resist 160 may have a shape different from that of an upper surface of the second portion of the solder resist 160. For example, an upper surface of the first portion of the solder resist 160 may have a concave shape. However, the embodiment is not limited thereto, and the upper surface of the first portion of the solder resist 160 may have a flat shape. For example, an upper surface of the second portion of the solder resist 160 may have a convex shape. That is, the upper surface of the second portion of the solder resist 160 may be positioned higher than the upper surface of the first portion of the solder resist 160.

In this case, a highest portion of the second portion of the solder resist 160 may have a second height H2. In addition, a lowest portion of the first portion of the solder resist 160 may have a third height H3. In this case, each of the second height H2 and the third height H3 may have a range of 7 μm to 17 μm.

Meanwhile, a difference value ΔH between the second height H2 and the third height H3 may have a range of 1 μm to 7 μm. For example, the third height H3 may have a range of 80% to 97% of the second height H2. For example, the third height H3 may have a range of 85% to 95% of the second height H2. The third height H3 may have a range of 88% to 92% of the second height H2.

That is, the solder resist 160 includes a negative photoresist (negative PR). And, the negative photoresist has a specific swelling phenomenon according to the environment.

For example, after the lamination process, a shape of an upper surface of the solder resist 160 may be controlled according to the environment and exposure time. That is, in the embodiment, the upper surface of the solder resist 160 may be changed into a desired shape by adjusting the degree of moisture adsorption of the negative photoresist by controlling the environment and exposure time after the lamination process of the solder resist 160.

At this time, moisture adsorbed in the solder resist 160 is concentrated between the circuit patterns due to inherently high surface tension (capillary effect). For example, the adsorbed moisture is more concentrated in a region where the upper outer layer circuit pattern 140 is not disposed than in a region where the upper outer layer circuit pattern 140 is disposed. Accordingly, the solder resist 160 has a flat shape or a concave shape in a region where the upper outer layer circuit pattern 140 is disposed, and a region where the upper outer layer circuit pattern 140 is not disposed has a convex shape as it swells upward due to a swelling phenomenon.

Next, referring to FIG. 12, an exposure process may be performed in an embodiment. The exposure process may be performed to thin a specific region of the solder resist 160.

The exposure may be performed only on the second region R2 of the first region R1 and the second region R2 of the solder resist 160.

Here, a portion exposed to light is cured and not thinned in the subsequent development process.

Next, referring to FIG. 13, a development process may be performed on an uncured portion in the exposure process. In this case, the solder resist 160 formed in the developed portion may have a height to expose the upper outer layer circuit pattern 140.

The development process may include a process of thinning the unexposed region using an organic alkaline compound containing tetramethylammonium hydroxide (TMAH) or trimethyl-2-hydroxyethylammonium hydroxide (choline).

The solder resist 160 of the embodiment is a first part disposed in the thinned first region R1, and a second part disposed in the non-thinning second region R2 as the above process proceeds. As described above, the second part of the solder resist 160 has a height difference between an area where the upper outer layer circuit pattern 140 is disposed and an area where the upper outer layer circuit pattern 140 is not disposed by swelling. That is, the upper surface of the second part of the solder resist 160 has a concave shape in the region where the upper outer layer circuit pattern 140 is disposed, and an upper surface of the second part of the solder resist 160 has a convex shape in a region where the upper outer layer circuit pattern 140 is not disposed.

Meanwhile, in the embodiment, as shown in FIG. 14, an additional process may be performed on the upper surface of the second part of the solder resist 160. For example, the upper surface of the second part of the solder resist 160 has a different height depending on the position, and a process of planarizing it may be additionally performed. For example, in the embodiment, a process of polishing the upper surface of the second part of the solder resist 160 may be performed to planarize the second part of the solder resist 160.

A circuit board in the embodiment is a circuit board having a structure of multi-layers with eight or more layers and includes an outer layer circuit pattern disposed on an outer insulating layer positioned at an uppermost portion among the multi-layers and protruding above a surface of the outer insulating layer. In this case, the outer layer circuit pattern includes a first outer layer circuit pattern disposed in a first region that is an open region where the solder resist is not disposed, and a second outer layer circuit pattern positioned in a second region where the solder resist is disposed. In this case, the second outer layer circuit pattern may be supported and protected by the solder resist, but the first outer layer circuit pattern does not have a support layer capable of supporting the first outer layer circuit pattern, and thus there is a problem that the first outer layer circuit pattern may easily collapse due to various factors.

Accordingly, the embodiment allows remaining without removing all of the solder resist in the first region, and accordingly, the first outer layer circuit pattern can be supported and protected by the solder resist. According to this, the embodiment can solve problems such as collapsing or rubbing of the first outer layer circuit pattern in the first region by miniaturizing the outer layer circuit pattern, thereby improving product reliability. In particular, the embodiment can solve problems such as collapsing or rubbing of a trace of the first outer layer circuit pattern in the first region, thereby improving product reliability.

Meanwhile, the solder resist of the embodiment includes a first part disposed in the first region and a second part disposed in the second region. In this case, an upper surface of the first part of the embodiment may have a convex shape in an upward direction. For example, an outer region of the upper surface of the first part of the solder resist may have a fourth height, and an inner region of the upper surface of the first part of the solder resist may have a fifth height greater than the fourth height. That is, an upper surface of the first part of the solder resist may include a highest portion having a highest height and a lowest portion having a lowest height. In addition, the lowest portion may be positioned closer to the outer layer circuit pattern than the highest portion. Accordingly, in the embodiment, the upper surface of the first part of the solder resist may have a convex shape, and thus a surface area of the first part of the solder resist may be increased. Accordingly, a contact surface with a layer additionally disposed on the first part (for example, a molding layer), thereby improving bonding strength. In addition, a height of the lowest portion is smaller than a height of the first outer layer circuit pattern. Accordingly, the embodiment can prevent a portion of the first part of the solder resist from remaining on a surface of the first outer layer circuit pattern, thereby improving reliability. In addition, in the embodiment, a height of the highest portion of the first part of the solder resist is greater than a height of the first outer layer circuit pattern. Accordingly, the embodiment may allow a dam function of an adhesive member to be implemented by the first part of the solder resist, thereby improving reliability.

In addition, the circuit board in the embodiment can be applied to a 5G communication system, and accordingly, transmission loss of a high frequency can be minimized, thereby further improving the reliability. Specifically, the circuit board in the embodiment can be used at the high frequency and can reduce wave loss.

The characteristics, structures, effects, and the like described in the above-described embodiments are included in at least one embodiment, but are not limited to only one embodiment. Furthermore, the characteristic, structure, and effect illustrated in each embodiment may be combined or modified for other embodiments by a person skilled in the art. Therefore, it should be construed that contents related to such combination and modification are included in the scope of the embodiment.

Embodiments are mostly described above, but the embodiments are merely examples and do not limit the embodiments, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the embodiment defined in the following claims.

The invention claimed is:

1. A circuit board, comprising:
an insulating structure including a plurality of insulating lavers laminated in a vertical direction layer;
an upper circuit pattern disposed on the insulating structure; and
a protective layer disposed on the insulating structure and the upper circuit pattern, wherein the protective layer includes a first part having a first thickness, and a second part having a second thickness greater than the first thickness, wherein an upper surface of the second part of the protective layer includes a plurality of convex portions and a concave portion provided between the plurality of convex portions, wherein the plurality of convex portions and the concave portion of the second part of the protective layer are positioned higher than an upper surface of the upper circuit pattern, and wherein a lowermost end of the concave portion of the second part overlaps the upper circuit pattern along the vertical direction.

2. The circuit board of claim 1, wherein the concave portion and the plurality of convex portions of the protective layer have a curved surface.

3. The circuit board of claim 1, further comprising:
a primer layer disposed on the insulating structure, wherein the primer layer is disposed between the insulating structure and the circuit pattern and the protective layer.

4. The circuit board of claim 3, further comprising:
a via electrode that penetrates the primer layer and at least a portion of the insulating structure and is connected to the circuit pattern.

5. The circuit board of claim 1, wherein the upper circuit pattern includes:
a plurality of first upper circuit patterns disposed on a first region of the insulating structure; and
a plurality of second upper circuit patterns disposed on a second region of the insulating structure, wherein the first part of the protective layer is disposed between the plurality of first upper circuit patterns and does not contact upper surfaces of the plurality of first upper circuit patterns, and wherein the second part of the protective layer is disposed between the plurality of second upper circuit patterns and on upper surfaces of the plurality of second upper circuit patterns.

6. The circuit board of claim 5, wherein an upper surface of the first part of the protective layer includes a plurality of convex portions provided between the plurality of first upper circuit patterns.

7. The circuit board of claim 6, wherein an uppermost end of the first part of the first part of the protective layer is positioned lower than upper surfaces of the plurality of first upper circuit patterns.

8. The circuit board of claim 6, wherein uppermost portions of the plurality of convex portions of the second part of the protective layer do not overlap with the plurality of second upper circuit patterns along the vertical direction.

9. The circuit board of claim 8, wherein a height of the lowermost portion of the concave portion of the second part has a range between 80% and 97% of a height of the uppermost portion of the convex portion of the second part.

10. The circuit board of claim 9, wherein a difference of the height of the uppermost portion of the convex portion and the height of the lowermost portion of the concave portion of the second part is 1 um to 7 um.

* * * * *